(12) United States Patent
Yamada et al.

(10) Patent No.: US 9,337,405 B2
(45) Date of Patent: May 10, 2016

(54) LIGHT EMITTING DEVICE AND METHOD FOR MANUFACTURING THE SAME

(71) Applicant: NICHIA CORPORATION, Anan-shi (JP)

(72) Inventors: Takao Yamada, Komatsushima (JP); Ikuko Baike, Komatsushima (JP); Ryo Suzuki, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/011,628

(22) Filed: Aug. 27, 2013

(65) Prior Publication Data

US 2014/0061704 A1 Mar. 6, 2014

(30) Foreign Application Priority Data

Aug. 31, 2012 (JP) ................ P2012-192143
Mar. 15, 2013 (JP) ................ P2013-054267

(51) Int. Cl.
*H01L 33/62* (2010.01)
*H01L 33/00* (2010.01)

(52) U.S. Cl.
CPC ............. *H01L 33/62* (2013.01); *H01L 33/0079* (2013.01); *H01L 2224/16* (2013.01); *H01L 2933/0066* (2013.01)

(58) Field of Classification Search
CPC ......... H01L 33/60; H01L 33/20; H01L 33/62; H01L 33/54; H01L 33/44
See application file for complete search history.

(56) References Cited

U.S. PATENT DOCUMENTS

| | | | | |
|---|---|---|---|---|
| 8,592,847 | B2* | 11/2013 | Chen et al. ................ | 257/98 |
| 2001/0003049 | A1* | 6/2001 | Fukasawa et al. ......... | 438/127 |
| 2002/0191406 | A1* | 12/2002 | Hashitani et al. .......... | 362/458 |
| 2005/0045899 | A1 | 3/2005 | Tsutsui | |
| 2005/0230853 | A1 | 10/2005 | Yoshikawa | |
| 2006/0091409 | A1 | 5/2006 | Epler et al. | |
| 2006/0240585 | A1 | 10/2006 | Epler et al. | |
| 2007/0126016 | A1* | 6/2007 | Chen et al. ................ | 257/96 |
| 2009/0101929 | A1 | 4/2009 | Mo et al. | |
| 2010/0041170 | A1 | 2/2010 | Epler et al. | |

(Continued)

FOREIGN PATENT DOCUMENTS

EP 2 479 233 A1 7/2012
JP 2004-39983 2/2004

(Continued)

OTHER PUBLICATIONS

Extended European Search Report dated Jan. 15, 2014 received in European Application No. 13182215.

*Primary Examiner* — Lex Malsawma
*Assistant Examiner* — Long Le
(74) *Attorney, Agent, or Firm* — Foley & Lardner LLP

(57) ABSTRACT

A method for manufacturing a light emitting device comprises (a) preparing a structure including a substrate, a semiconductor layer formed on the substrate, and a p-side electrode and an n-side electrode formed on the semiconductor layer; (b) preparing a support member including a p-side wiring and an n-side wiring on the same surface thereof; (c) electrically connecting the p-side electrode and the n-side electrode of the structure to the p-side wiring and the n-side wiring of the support member, respectively, using an anisotropic conductive material containing conductive particles and a first resin; and after step (c), (d) removing the substrate from the structure.

27 Claims, 25 Drawing Sheets

(56) References Cited

U.S. PATENT DOCUMENTS

| | | |
|---|---|---|
| 2011/0084301 A1 | 4/2011 | Epler et al. |
| 2011/0215365 A1* | 9/2011 | Lin .................................. 257/99 |
| 2011/0315956 A1* | 12/2011 | Tischler et al. ................. 257/13 |
| 2012/0086041 A1 | 4/2012 | Isogai |
| 2012/0112220 A1* | 5/2012 | West et al. ...................... 257/98 |
| 2012/0193666 A1 | 8/2012 | Namiki et al. |

FOREIGN PATENT DOCUMENTS

| | | |
|---|---|---|
| JP | 2006-128710 | 5/2006 |
| JP | 2008-108905 | 5/2008 |
| JP | 2011-501428 | 1/2011 |
| JP | 2011-057917 | 3/2011 |
| JP | 2012-231122 | 11/2012 |

* cited by examiner

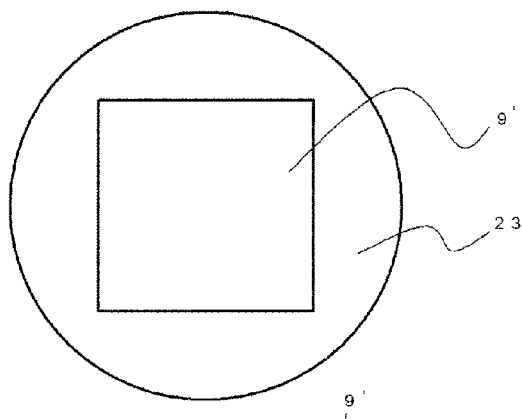
FIG. 22A
FIG. 22B
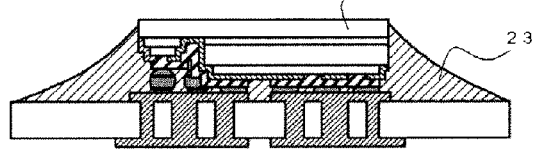
FIG. 22C
FIG. 22E
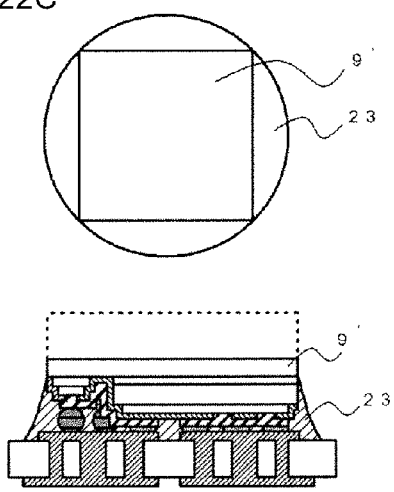
FIG. 22D
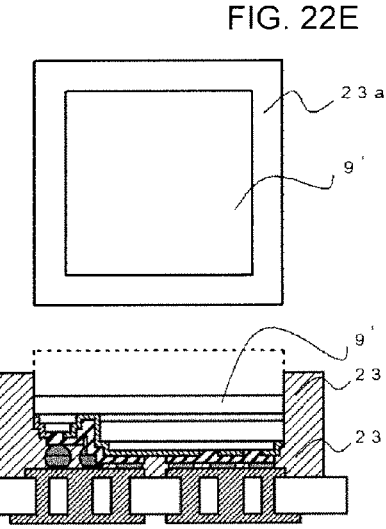
FIG. 22F

LIGHT EMITTING DEVICE AND METHOD FOR MANUFACTURING THE SAME

CROSS-REFERENCE TO RELATED APPLICATIONS

This application claims priority to and the benefit of Japanese Patent Application No. 2012-192143 filed Aug. 31, 2012 and Japanese Patent Application No. 2013-54267 filed Mar. 15, 2013, the entire contents of which are incorporated herein by reference.

BACKGROUND

1. Technical Field

The present disclosure relates to a light emitting device and a method for manufacturing a light emitting device.

2. Background Art

Light emitting devices are generally manufactured by mounting a light emitting element, such as a light emitting diode, on a support member. One of the mounting methods is flip-chip mounting (see JP 2011-501428 A, JP 2011-57917 A). Flip-chip mounting is advantageous because it allows wirelessly mounting of the light emitting element on the support member, reducing the area of the light emitting device, and leading to high light extraction efficiency in the vertical direction.

In order to further improve light extraction efficiency, a light emitting device is conventionally known which is manufactured by flip-chip mounting a light emitting element on a support member, and then removing a substrate. More specifically, such a light emitting device is manufactured as follows (see JP 2011-501428 A). First, an n-type semiconductor layer, an active layer, and a p-type semiconductor layer are grown on a substrate for growth, such as a sapphire substrate. Then, the p-type semiconductor layer and the active layer are partly removed by etching to expose the n-type semiconductor layer. A p-side electrode and an n-side electrode are formed on the same side of the thus-obtained semiconductor layer opposite to the substrate. Au bumps are formed on the p-side electrode and the n-side electrode. Thus, light emitting element chip is manufactured. On the other hand, a support member including a p-side wiring and an n-side wiring on the same surface is prepared. Then, the chip is opposed to the support member (by reversing the chip from top to bottom), and the respective Au bumps formed on the p-side and n-side electrodes of the chip are mechanically and electrically connected to the p-side and n-side wirings of the support member by ultrasonic bonding. An electrically insulating underfill resin (silicone-based resin) is charged into a space formed between the chip and the support member, and then cured. Thereafter, the substrate for growth is removed from the chip by laser liftoff. A phosphor plate or the like can be bonded on the exposed semiconductor layer, as appropriate.

SUMMARY OF INVENTION

In one aspect, a method for manufacturing a light emitting device is provided. The method comprises: (a) preparing a structure including a substrate, a semiconductor layer formed on the substrate, and a p-side electrode and an n-side electrode formed on the semiconductor layer; (b) preparing a support member including a p-side wiring and an n-side wiring on the same surface thereof; (c) electrically connecting the p-side electrode and the n-side electrode of the structure with the p-side wiring and the n-side wiring of the support member, respectively, using anisotropic conductive material containing conductive particles and a first resin; and (d) removing the substrate from the structure to form the light emitting element.

In another aspect, a light emitting device comprises: a light emitting element including a semiconductor layer (generally, a laminate of a plurality of semiconductor layers), and a p-side electrode and an n-side electrode formed on the same side of the semiconductor layer, wherein a surface of the semiconductor layer forms a top surface of the light emitting element; and a support member including a p-side wiring and an n-side wiring on the same surface; and an anisotropic conductive material containing conductive particles and a first resin. The p-side electrode and the n-side electrode of the light emitting element are electrically connected to the p-side wiring and the n-side wiring of the support member, respectively, by at least the anisotropic conductive material.

BRIEF DESCRIPTION OF DRAWINGS

FIG. 22 shows schematic plan views and schematic cross-sectional views for explaining examples of a wall part of the light emitting device according to the fourth embodiment, FIG. 22A showing a top view of an embodiment in which the anisotropic conductive material covers the whole of the upper surface of the support member, FIG. 22B showing a side cross-sectional view of the embodiment of FIG. 22A, FIG. 22C showing a top view of an embodiment in which the conductive material does not protrude beyond the upper surface of the light emitting element and has a shape without a wall part, FIG. 22D showing a side cross-sectional view of the embodiment of FIG. 22C, FIG. 22E showing a top view of an embodiment in which the anisotropic conductive material surrounds the light emitting element in an almost uniform width, and FIG. 22F showing a side cross-sectional view of the embodiment of FIG. 22E.

DETAILED DESCRIPTION

Figure 1A:
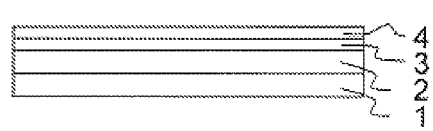
FIG. 1 shows schematic process steps for explaining a method for manufacturing a light emitting device according to a first embodiment, FIG. 1A showing an n-type semiconductor layer, an active layer, and a p-type semiconductor layer laminated on the substrate, FIG. 1B showing the p-type semiconductor layer, the active layer, and the n-type semiconductor layer partly removed by etching to expose the n-type semiconductor layer, FIG. 1C showing a p-side electrode formed on the p-type semiconductor layer, and an n-side electrode formed on the exposed n-type semiconductor layer, and FIG. 1D showing a light emitting element chip obtained by cutting the structure into a predetermined size.

According to one embodiment, a method for manufacturing a light emitting device, wherein a light emitting element is flip-chip mounted on a support member, comprises: (a) preparing a structure including a substrate, a semiconductor layer formed on the substrate, and a p-side electrode and an n-side electrode formed on the semiconductor layer; (b) preparing a support member including a p-side wiring and an n-side wiring on the same surface thereof; (c) electrically connecting the p-side electrode and the n-side electrode of the structure to the p-side wiring and the n-side wiring of the support member, respectively, using anisotropic conductive material containing conductive particles and a first resin; and then (d) removing the substrate from the structure to form the light emitting element.

According to the method for manufacturing a light emitting device in embodiments of the present invention, since the substrate is removed, high light extraction efficiency can be obtained. Further, since the anisotropic conductive material is used between the support member and the light emitting element to electrically connects them together by the anisotropic conductive material, both filling and electrical conduction with the anisotropic conductive material between the support member and the light emitting element can be realized simultaneously. Then, the p-side and n-side wirings are electrically connected to the p-side and n-side electrodes using the anisotropic conductive material, and such electrical connection is relatively flexibly established through the conductive particles in the anisotropic conductive material. Thus, even if the thus-obtained light emitting device is exposed to change in temperature, the thermal stress caused by the thermal expansion of the anisotropic conductive material is uniformly applied to the whole of the semiconductor layer, and therefore this can reduce or prevent breakage of the semiconductor layer and can lead to high reliability. Accordingly, the combination of removal of the substrate and bonding using the anisotropic conductive material can realize a light emitting device showing both high light extraction efficiency and high reliability.

In one embodiment, in the step (c), the anisotropic conductive material fills a space between the structure and the support member. The anisotropic conductive material may be at least partly in contact with a side surface of the substrate. In this embodiment, the substrate can be held at its side surface upon removing the substrate from the structure in the step (d). In this specification, the word "fill" means that an object (more specifically, the anisotropic conductive material) "substantially fills in (or takes up)" a space.

In one embodiment, in the step (d), the removal of the substrate can be conducted by laser irradiation (at a wavelength capable of passing through the substrate). This embodiment can allow for easy removal of the substrate, and thus can provide a method for manufacturing a light emitting device with excellent mass productivity. Particularly, when the substrate is held at its side surface by the anisotropic conductive material, the substrate can be prevented from being blown off at the same time as the removal of the substrate by the laser irradiation.

In one embodiment, the method for manufacturing a light emitting device further comprises, after the step (c), (p) forming a light reflector on the anisotropic conductive material so as to surround the structure (or the light emitting element), the light reflector having a higher reflectivity than that of the anisotropic conductive material. According to such embodiment, the light reflector is formed around the semiconductor layer as viewed from a light extraction side, so that the brightness performance (light flux) of the light emitting device can be increased.

In a preferred embodiment, the step (p) is conducted before the step (d). According to such embodiment, impairment of the brightness performance can be prevented by the fact that, a material for forming the light reflector may not attach to the upper surface of the semiconductor layer exposed by the removal of the substrate, which may otherwise occur.

The light reflector is selected from the group consisting of, for example, a layer containing a silicone-based resin and light reflective particles dispersed therein, a metal layer, and a dielectric multilayer structure.

In one embodiment, the method for manufacturing a light emitting device further comprises, after the step (d), (q) forming a phosphor layer on the semiconductor layer exposed by the removal of the substrate. This embodiment can allow for changing the color of light (color temperature) emitted from the light emitting device according to the composition of a phosphor used.

The step (q) can be conducted by, for example, bonding a phosphor sheet (which can be also referred to as a phosphor plate) or electrodepositing a phosphor film on the semiconductor layer.

In one embodiment, the method for manufacturing a light emitting device further comprises, after the step (d) and before the step (q), (r) removing a part of the anisotropic conductive material which protrudes as compared to the semiconductor layer exposed by the removal of the substrate at a periphery of the semiconductor layer (when the light reflector is formed, a part of the light reflector positioned on that part of the anisotropic conductive material is removed together). According to such embodiment, the brightness performance can be increased as compared to the case where the light emitting device finally obtained has the above part of the anisotropic conductive material.

Alternatively, for example, the step (q) can be conducted by supplying a phosphor containing resin into a recessed portion surrounded by a wall part on the semiconductor layer, and curing the phosphor containing resin, wherein the wall part corresponds to a part of the anisotropic conductive material which protrudes as compared to the semiconductor layer exposed by the removal of the substrate at a periphery of the semiconductor layer. According to such embodiment, the phosphor layer can be easily obtained with the same size as that of the upper surface of the semiconductor layer exposed by the removal of the substrate. Thus, this can reduce the area of the light emitting device finally obtained, and thereby increase the brightness per unit area.

The method for manufacturing a light emitting device of the present embodiment is not specifically limited as long as the p-side electrode and the n-side electrode of the structure are electrically connected to the p-side wiring and the n-side wiring of the support member, respectively, with the use of the anisotropic conductive material. For example, the electrical connection between the p-side and n-side electrodes of the structure and the p-side and n-side wirings of the support member may be established either only by the anisotropic conductive material (more specifically, the conductive particles in the anisotropic conductive material), or by another conductive member in addition to the anisotropic conductive material.

In one embodiment, the method for manufacturing a light emitting device may further comprise, before the step (c), (s) forming bumps on the p-side electrode and the n-side electrode of the structure, or on the p-side wiring and the n-side wiring of the support member. In the step (c), the p-side electrode and the n-side electrode of the structure may be electrically connected to the p-side wiring and the n-side wiring of the support member, respectively, via the bumps using the anisotropic conductive material. The electrical connection can be achieved by electrically connecting the bumps to the p-side and n-side wirings or the p-side and n-side electrodes using the anisotropic conductive material. Such electrical connection is relatively flexibly established via conductive particles in the anisotropic conductive material. Thus, even when the light emitting device obtained in this embodiment is exposed to change in temperature, a thermal stress caused by a difference in thermal expansion between the bumps and the anisotropic conductive material cannot be transferred directly to the semiconductor layer. Further, the light emitting device thus obtained relieves the thermal stress caused by a difference in thermal expansion between the bumps and the anisotropic conductive material, as compared to the case where the bumps and the p-side and n-side wirings or the p-side and n-side electrodes are directly connected (or joined together) without the conductive particles. As a result, breakage of the semiconductor layer can be reduced or prevented, and high reliability can be obtained.

In one embodiment, in the step (a), the p-side electrode and the n-side electrode may be covered with a protective film formed with openings, and in the step (s), the bumps may be formed on the p-side electrode and the n-side electrode so as to be positioned in the openings of the protective film and to have their respective tops protruding as compared to the protective film. In this case, since the p-side and n-side electrodes are covered with the protective film, the electrodes can be protected from scratches that might be caused during the steps (manufacturing process). Also in this case, since the bumps are formed on the p-side and n-side electrodes (on the structure side), the structure can be easily aligned and mounted on the support member as compared to the case where the bumps are formed on the p-side and n-side wirings (on the support-member side).

The anisotropic conductive material used in embodiments of the present invention may further contain a filler, and the filler may be at least one selected from the group consisting of a metal oxide, a metal nitride, and carbon (for example, in the form of particles). Such a filler can reduce the thermal resistance of the anisotropic conductive material, and can effectively discharge an amount of heat, which is generated from the semiconductor layer together with a light, to the outside through the anisotropic conductive material.

Regarding the anisotropic conductive material used in embodiments of the present invention, the conductive particles preferably comprise a core made of a second resin, and a conductive layer covering the core and made of metal (for example, the conductive particles may be composed of them). According to this embodiment, since both the inside and outside of the conductive particles of the anisotropic conductive material are made of resins (the first resin and the second resin, respectively), they shows similar behavior of expansion and contraction under heat. Thus, even if the light emitting device is exposed to change in temperature, the thermal stress caused in the anisotropic conductive material can be made small, and therefore this can effectively reduce or prevent breakage of the semiconductor layer while the electrical connection is sufficiently maintained.

Specifically, a ratio of an absolute value of a difference between a thermal expansion coefficient of the first resin and a thermal expansion coefficient of the second resin to the thermal expansion coefficient of the first resin is preferably 1.0 or less. In the present embodiment, the thermal expansion coefficient means a linear expansion coefficient. The thermal expansion coefficient of each of the first and second resins indicates a thermal expansion coefficient of the resin in the cured state (in the same state as that of the resin contained in the light emitting device as a product). A thermal expansion coefficient is known for various kinds of resins, but it can be measured as an average linear expansion coefficient between at temperatures of 25° C. and 85° C. according to JIS K7197.

The anisotropic conductive material may contain other components such as the above filler, in addition to the conductive particles and the first resin. Such filler or the like affects the average thermal expansion coefficient of a material corresponding to the anisotropic conductive material from which the conductive particles are excluded. Thus, a ratio of an absolute value of a difference between the thermal expansion coefficient of the second resin and the average thermal expansion coefficient of the material corresponding to the anisotropic conductive material from which the conductive particles are excluded, to the average thermal expansion coefficient is preferably 1.0 or less. In the present embodiment, the average thermal expansion coefficient of the material corresponding to the anisotropic conductive material from which the conductive particles are excluded is calculated, with regard to remaining materials (or components) from the constituent materials of the anisotropic conductive material after exclusion of the conductive particles, by multiplying the thermal expansion coefficient of the remaining materials by their respective compounding ratios (volume ratio), and then by summing the multiplied values. For simplification, a component(s) blended in a small amount is negligible.

A light emitting device according to one embodiment of the present invention comprises: a light emitting element including a semiconductor layer (generally, a laminate of a plurality of semiconductor layers), and a p-side electrode and an n-side electrode formed on the same side of the semiconductor layer, wherein a surface of the semiconductor layer forms a top surface of the light emitting element; and a support member including a p-side wiring and an n-side wiring on the same surface (and further in some cases, a phosphor layer disposed on an opposite side of the semiconductor layer of the light emitting element to the side on which the p-side electrode and the n-side electrode are formed), wherein the p-side electrode and the n-side electrode of the light emitting element are electrically connected to the p-side wiring and the n-side wiring of the support member, respectively, by at least an anisotropic conductive material, the anisotropic conductive material containing conductive particles and a first resin.

According to this embodiment, the side of the semiconductor layer opposite to the side on which the p-side electrode and the n-side electrode are formed (that is, the surface of the semiconductor layer exposed by removing the substrate therefrom) forms the top surface of the light emitting element (in some cases, the phosphor layer is formed thereon), and thereby the light emitting device can be obtained with high light extraction efficiency and high brightness. The p-side and n-side wirings are electrically connected to the p-side and n-side electrodes by the anisotropic conductive material, and such electrical connection is, more specifically, relatively flexibly established through the conductive particles in the anisotropic conductive material. Thus, even if the thus-obtained light emitting device of the present embodiment is exposed to changes in temperature, the thermal stress caused by the thermal expansion of the anisotropic conductive material is uniformly applied to the whole of the semiconductor layer, and therefore this can reduce or prevent breakage of the semiconductor layer and can lead to high reliability.

In the light emitting device of the present embodiment, the anisotropic conductive material fills a space between the light emitting element and the support member. In the presence of the phosphor layer, the anisotropic conductive material may be at least partly in contact with side surfaces of the phosphor layer.

In one embodiment, the light emitting device may further comprise bumps formed on the p-side electrode and the n-side electrode of the light emitting element, or the p-side wiring and the n-side wiring of the support member, and the p-side electrode and the n-side electrode of the light emitting element may be electrically connected to the p-side wiring and the n-side wiring of the support member, respectively, by the anisotropic conductive material and the bumps. The electrical connection can be achieved by electrically connecting the bumps to the p-side and n-side wirings or the p-side and n-side electrodes by the anisotropic conductive material. Such electrical connection is relatively flexibly established via the conductive particles of the anisotropic conductive material. Thus, even when the light emitting device in this embodiment is exposed to change in temperature, a thermal stress caused by a difference in thermal expansion between the bumps and the anisotropic conductive material cannot be transferred directly to the semiconductor layer. Further, this light emitting device relieves the thermal stress caused by a difference in thermal expansion between the bumps and the anisotropic conductive material, as compared to the case where the bumps and the p-side and n-side wirings or the p-side and n-side electrodes are directly connected (or joined together) without the conductive particles. As a result of this, breakage of the semiconductor layer can be further reduced or prevented and high reliability can be obtained.

In one embodiment, the light emitting device further comprises a light reflector disposed on the anisotropic conductive material around the light emitting element. According to such embodiment, a light reflector made of a material having a higher reflectivity than that of the anisotropic conductive material is formed on the anisotropic conductive material (on its upper surface and side surface) exposed around the light emitting element, so that light absorption by the anisotropic conductive material can be suppressed, and thereby light extraction efficiency can be increased.

In another embodiment, a method for manufacturing a light emitting device, wherein a light emitting element is flip-chip mounted on a support member, comprises: (a) preparing a structure including a substrate, a semiconductor layer formed on the substrate and including a first semiconductor layer (e.g. an n-type semiconductor layer) and a second semiconductor layer (e.g. a p-type semiconductor layer), an n-side electrode electrically connected to the first semiconductor layer, a p-side electrode electrically connected to the second semiconductor layer, and a metal member formed on an opposite surface to the substrate so as to overlap with the first semiconductor layer and the second semiconductor layer; (b) preparing a support member including a p-side wiring and an n-side wiring on the same surface thereof; (c) electrically connecting the p-side electrode and the n-side electrode of the structure to the p-side wiring and the n-side wiring of the support member, respectively, using an anisotropic conductive material containing conductive particles and a first resin; and (d) removing the substrate from the structure to form the light emitting element.

In this way, since the substrate for an LED chip (chip) is removed, high light extraction efficiency can be obtained. Further, since the anisotropic conductive material fills the space between the support member and the light emitting element by using the anisotropic conductive material between the support member and the light emitting element, both the supporting and reinforcement of the light emitting element and the electrical connection can be realized simultaneously, and mass productivity can be increased.

Additionally, since the light emitting element including the metal member formed to overlap with the first semiconductor layer and the second semiconductor layer is used, the strength of the light emitting element can be increased, and mass productivity and reliability can be increased.

In the present embodiment, the metal member "overlaps" with the first semiconductor layer and the second semiconductor layer. This means that the metal member is formed to extend across a part of the first semiconductor layer on which the second semiconductor layer is not laminated (i.e. an exposed part of the first semiconductor layer) to the second semiconductor layer. That is, in a cross section including a lamination direction of the laminated semiconductor layers, the metal member has a region overlapping with at least a part of the exposed part of the first semiconductor layer in the lamination direction, and a region overlapping with at least a part of the second semiconductor layer in the lamination direction.

The metal member may be formed so as to overlap with the second semiconductor layer while an insulating layer is disposed therebetween. In other words, in the cross section including the lamination direction of the semiconductor layers, the metal member may be formed to extend on and from the exposed part of the first semiconductor layer to at least a part of the second semiconductor layer via the insulating layer. The metal member may form at least a part of the n-side electrode and/or the p-side electrode. For example, the metal member may be the n-side electrode formed to overlap with the second semiconductor layer.

In one embodiment, a light emitting device comprises: a light emitting element including a semiconductor layer including a first semiconductor layer and a second semiconductor layer, an n-side electrode electrically connected to the first semiconductor layer, and a p-side electrode electrically connected to the second semiconductor layer, wherein the semiconductor layer forms a top surface of the light emitting element; and a support member having a p-side wiring and an n-side wiring on the same surface, wherein the p-side electrode and the n-side electrode of the light emitting element are electrically connected to the p-side wiring and the n-side wiring of the support member, respectively, by an anisotropic conductive material, and the light emitting element includes a metal member formed on an opposite surface to the first semiconductor layer so as to overlap with the first semiconductor layer and the second semiconductor layer.

In this way, since the top surface at the light extraction side of the light emitting element is formed of the semiconductor layer, high light extraction efficiency can be obtained. Further, since the anisotropic conductive material fills the space between the support member and the light emitting element by using the anisotropic conductive material between the support member and the light emitting element including the first semiconductor layer, the second semiconductor layer, the n-side electrode electrically connected to the first semiconductor layer, the p-side electrode electrically connected to the second semiconductor layer, and the metal member formed on the surface at the second semiconductor's side so as to overlap with the first semiconductor layer and the second semiconductor layer, both the supporting and reinforcement of the light emitting element and the electrical connection can be realized simultaneously, and the strength of the light emitting element can be increased, and it becomes possible to provide the light emitting device with increased mass productivity and reliability.

Methods for manufacturing a light emitting device according to embodiments of the present invention will be described in detail below with reference to the accompanying drawings. For the purpose of easier understanding of the invention, the present invention will be described in separate embodiments. These embodiments, however, are not independent from each other. As to the commonly applicable features and/or structures to the embodiments, the descriptions in respective embodiments can be applied to each other. It is noted that the accompanying drawings may include emphasized parts for the purpose of easier understanding of the invention.

(First Embodiment)

In a first embodiment, p-side and n-side electrodes of a light emitting element are electrically connected to p-side and n-side wirings of a support member, respectively, by an anisotropic conductive material without bumps.

Figure 1B:
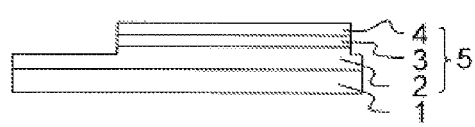
Figure 1C:
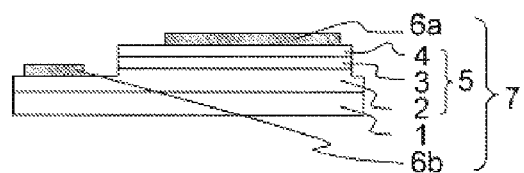

As shown in FIGS. 1A to 1C, a structure 7 which includes a substrate 1, a semiconductor layer 5, and a p-side electrode 6a and an n-side electrode 6b formed on the same side of the semiconductor layer 5 opposite to the substrate 1 is prepared. Specifically, as shown in FIG. 1A, at least an n-type semiconductor layer 2, an active layer 3, and a p-type semiconductor layer 4 are laminated on the substrate (substrate for growth) 1 in this order to thereby form the semiconductor layer containing these layers (sub-layers). The semiconductor layer may contain a buffer layer, a contact layer and the like, as appropriate. Typically, a sapphire substrate can be used as the substrate 1, and the n-type semiconductor layer 2, the active layer 3, and the p-type semiconductor layer 4 can be composed of nitride semiconductor. Then, as shown in FIG. 1B, the p-type semiconductor layer 4, the active layer 3, and the n-type semiconductor layer 2 are partly removed by etching to expose the n-type semiconductor layer 2, and thereby the semiconductor layer (laminate) 5 is obtained. Thereafter, as shown in FIG. 1C, the p-side electrode 6a is formed on the p-type semiconductor layer 4 as the top layer, and the n-side electrode 6b is formed on the exposed n-type semiconductor layer 2. For example, the p-side electrode 6a may be a reflective electrode containing Ag, and the n-side electrode 6b may be a reflective electrode containing Al. As the p-side electrode 6a and the n-side electrode 6b, a translucent electrode such as ITO may be formed, if preferable.

Figure 1D:
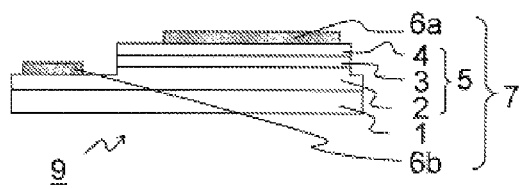

Then, a light emitting element chip (dice) 9 is obtained by appropriately cutting the structure into a predetermined size (see FIG. 1D).

As described above, there is manufactured the chip 9 provided with the structure 7 including the substrate 1, the semiconductor layer 5 formed on the substrate 1, and the p-side electrode 6a and the n-side electrode 6b formed on the same side of the semiconductor layer 5 opposite to the substrate 1. The chip 9 is generally a light-emitting diode. Materials, shapes, and forming methods of each of the constituent members of the chip 9 can be changed, as appropriate.

Figure 2A:
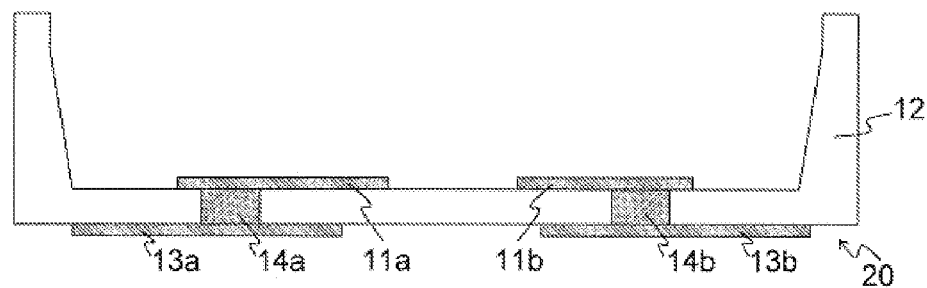
FIG. 2 shows schematic process steps for explaining the method for manufacturing a light emitting device according to the first embodiment, FIG. 2A showing a support member including a p-side wiring and an n-side wiring on the same surface, and FIG. 2B showing an anisotropic conductive material filling the space between the chip and the support member.

On the other hand, as shown in FIG. 2A, a support member 20 including a p-side wiring 11a and an n-side wiring 11b on the same surface is prepared. The support member 20 may be a molded package. In the embodiment shown in the drawings, the support member 20 includes a resin molded article 12 with a concave portion for containing the chip 9, the p-side wiring 11a and the n-side wiring 11b formed on the bottom of the concave portion, leads 13a and 13b formed on the backside of the resin molded article 12, and vias 14a and 14b made of a conductive material for electrical connection between them.

Figure 6:
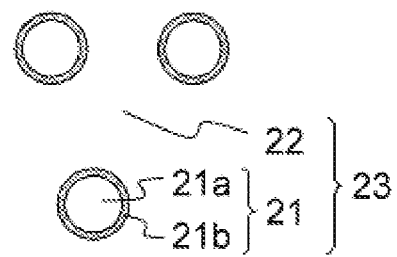
FIG. 6 shows a schematic cross-sectional view of anisotropic conductive material usable in the first embodiment.

Then, anisotropic conductive material 23 is supplied onto the bottom of the concave portion of the support member 20. The anisotropic conductive material 23 contains a first resin as a binder resin 22, and conductive particles 21 dispersed in the binder resin (first resin) 22, and may contain other components if necessary. In the first embodiment, as shown in FIG. 6, the conductive particles 21 include a core 21a made of a second resin, and a conductive layer 21b covering the core 21a and made of metal. The composition of the anisotropic conductive material 23 (content ratio of each of the binder resin 22, the conductive particles 21, and other components if present), the average particle size of the conductive particles 21, the thickness of the conductive layer 21b and the like can be selected, as appropriate.

The first resin as the binder resin 22 is a thermosetting resin such as epoxy resin, and may be mixed with a thermoplastic resin or the like in some cases. The second resin forming the core 21a of the conductive particles 21 may be any appropriate resin, for example, methacrylic resin. Table 1 shows examples of resins usable for the first resin and the second resin. As to the first resin and the second resin, it is preferable that a ratio of an absolute value of a difference between a thermal expansion coefficient $k_1$ of the first resin and a thermal expansion coefficient $k_2$ of the second resin to the thermal expansion coefficient $k_1$ of the first resin ($=|k_2-k_1|/k_1$) is 1.0 or less, this ratio is more preferably 0.5 or less, and most preferably 0.2 or less. The combinations of the first resin and the second resin can include, for example, epoxy resin and methacrylic resin; epoxy resin and acrylic resin; and the like. The first resin and the second resin can be different from each other, or may be the same (in the latter case, the above ratio becomes a minimum of zero).

TABLE 1

| Resin | Thermal expansion coefficient (linear expansion coefficient) ($10^{-5}/°$ C.) |
| --- | --- |
| Epoxy resin | 62 |
| Methacrylic resin | 70 |
| Acrylic resin | 74 |

The conductive layer 21b of the conductive particles 21 is made of metal, for example, Au, Ni, and the like. The conductive layer 21b can be formed on the surface of the core 21a made of the second resin by, for example, performing electroless plating, electroplating, mechano-fusion (mechano-chemical reaction), or the like. The content of the conductive particles 21 in the anisotropic conductive material 23 is not specifically limited, and can be selected as appropriate.

Other components that can be contained in the anisotropic conductive material 23 include filler, and additives such as a curing accelerator, a viscosity modifier and the like. The filler may be of a material having higher heat conductivity than the binder resin 22, for example, a metal oxide (e.g. $TiO_2$, $Al_2O_3$, and the like), a metal nitride (e.g. MN, and the like), carbon, and the like. The filler may be in the form of particles, which generally have a particle size smaller than that of the conductive particles. The filler content of the anisotropic conductive material 23 is not specifically limited, but may be, for example, 5 to 80% by volume, and preferably 30 to 70% by volume. A compounding ratio of the first resin to the filler in a material corresponding to the anisotropic conductive material 23 from which the conductive particles 21 are excluded is, for example, 100:10 to 90, and preferably 100:40 to 80 (volumetric basis). It is preferable that a ratio of an absolute value of a difference between the thermal expansion coefficient $k_2$ of the second resin and an average thermal expansion coefficient $k_a$ of the material corresponding to the anisotropic conductive material 23 from which the conductive particles 21 are excluded, to the average thermal expansion coefficient $k_a$ ($=|k_2-k_a|/k_a$) is 1.0 or less, and this ratio is more preferably 0.5 or less, and most preferably 0.2 or less. In this regard, other additives can be blended in the anisotropic conductive material 23 at small amounts, and thus they are negligible in the calculation of the average thermal expansion coefficient $k_a$. The difference between the thermal expansion coefficient $k_1$ and the average thermal expansion coefficient $k_a$ is mainly due to the presence of the filler. The addition of the filler can improve the heat dissipation and can adjust the average thermal expansion coefficient $k_a$.

Figure 2B:
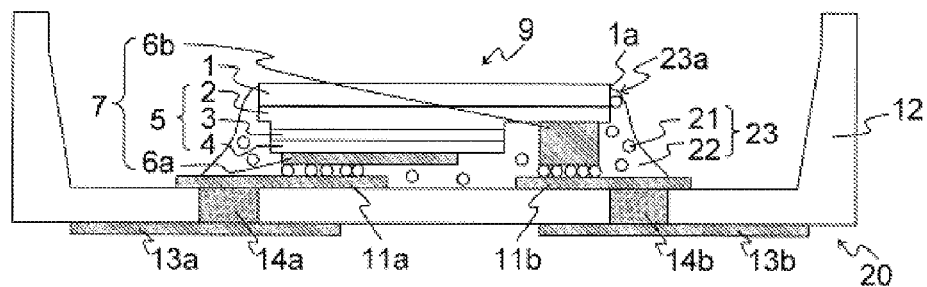

The supply amount and the viscosity of the anisotropic conductive material 23 can be adjusted so as to bring about the state described below with reference to FIG. 2B.

The chip 9 shown in FIG. 1D is reversed from top to bottom and placed on the anisotropic conductive material 23, which is supplied onto the bottom of the concave portion of the support member 20 as mentioned above, while being aligned with respect to the support member 20, and then it is pressed and heated. Thereby, as shown in FIG. 2B, the anisotropic conductive material 23 fills the space between the chip 9 (more specifically, the above structure, the same shall apply hereinafter) and the support member 20, and also mechanically (or physically) bonds the chip 9 to the support member 20 by curing the binder resin 22 in a state where the anisotropic conductive material 23 at least partly in contact with the side surfaces (or lateral surface, the same shall apply hereinafter) 1a of the substrate 1 of the chip 9 at its wall part 23a. Further, at this time, the conductive particles 21 in the anisotropic conductive material 23 are bonded while being pressed between the electrodes 6a, 6b and the wirings 11a, 11b to thereby electrically connecting them, respectively. That is, the pressing and heating make the binder resin 22 pushed to spread, and at least one or more conductive particles 21 are disposed between the opposed electrodes and wirings, so that electrical anisotropy is expressed with the conductivity in the thickness direction and the insulation in the in-plane direction in the pressed part. The reliability of the connection can be maintained by keeping the conductive particles 21 disposed between the opposed electrodes and wirings by cohesion force of the binder resin 22. As a result, the p-side electrode 6a and the n-side electrode 6b of the chip 9 (more specifically, the structure 7) are electrically connected to the p-side wiring 11a and the n-side wiring 11b of the support member 20, respectively, by the anisotropic conductive material 23 (containing the conductive particles 21 and the first resin 22).

In the first embodiment, the chip 9 is provided on the support member 20 via the anisotropic conductive material 23 with respect to the entire chip 9, so that the thermal stress generated by thermal expansion of the anisotropic conductive material 23 is uniformly transferred to the entire semiconductor layer 5, which can prevent cracking in the semiconductor layer 5.

Figure 3A:
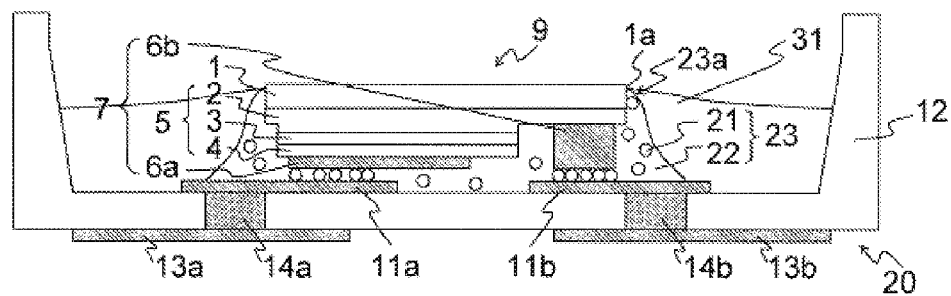
FIG. 3 shows schematic process steps for explaining the method for manufacturing a light emitting device according to the first embodiment, FIG. 3A showing a light reflector formed on the anisotropic conductive material so as to surround the chip, and FIG. 3B showing the device with the substrate removed from the chip.

Then, as shown in FIG. 3A, a light reflector 31 having a higher reflectivity than the anisotropic conductive material 23 is formed on the anisotropic conductive material 23 so as to surround the chip 9. The formation of the light reflector 31 can increase the brightness performance (light flux) of the light emitting device finally obtained. As shown in the drawings, the light reflector 31 may be in contact with a part of the support member 20 exposed from the anisotropic conductive material 23 within the concave portion of the resin molded article 12.

The light reflector 31 may be, for example, a layer containing a silicone-based resin and light reflective particles (e.g. particles of $TiO_2$, $SiO_2$, $ZrO_2$, $BaSO_4$, MgO, and the like) dispersed therein, a metal layer (e.g. a single layer or a multilayer comprised of Ag, Al, or the like), or a dielectric multilayer structure. The layer made of a silicone-based resin and the light reflective particles dispersed therein can be formed by supplying a material (high reflective material) of an uncured silicone-based resin with the light reflective particles dispersed therein onto the anisotropic conductive material 23, and curing the material. Instead of the silicone-based resin, any other curable resin by, for example, heat, light and/or humidity may be used. When the metal reflector 31 is made of a metal layer, it can be formed by sputtering or vapor deposition. When the light reflector 31 is made of a dielectric multi-layer structure, it can be formed by a multi-layer lamination by sputtering, and the number of dielectric layers can be selected as appropriate.

Figure 3B:
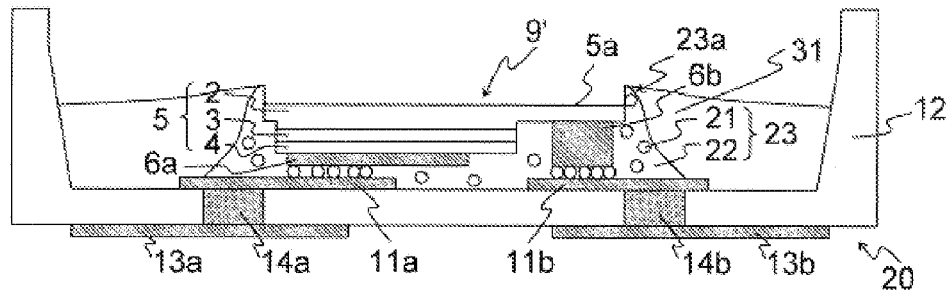

After that, as shown in FIG. 3B, the substrate 1 is removed from the chip 9. The removal of the substrate 1 can be conducted by laser irradiation. For this purpose, a laser liftoff (LLO) technique can be applied, which may involve irradiating the substrate 1 from its exposed (back) side with a high power laser light such as an excimer laser to sublimate/gasify semiconductor substance in the vicinity of the boundary between the substrate 1 and the semiconductor layer 5, thereby separating the substrate 1 from the semiconductor layer 5, and stripping away the substrate 1 by picking it up. In the conventional method, there would be a problem that, during stripping of the substrate 1 by the laser lift-off, the substrate might be blown off upon stripping and damage an optical part of the laser irradiation device, which impairs mass productivity by shortening the maintenance cycle. According to the first embodiment, in contrast, the anisotropic conductive material 23 is cured at least partly in contact with the side surfaces 1a of the substrate 1 and therefore holds the substrate 1, so that the substrate 1 on stripping is prevented from being blown off, and mass productivity is improved. The holding force by the anisotropic conductive material is larger than that by an underfill generally used in the art, and is at a degree capable of preventing the substrate on stripping from being blown off and of mechanically picking up the substrate 1 after separation.

In the first embodiment, since the light reflector 31 is formed before the removal of the substrate 1, the material for forming the light reflector 31 is prevented from being attached to un upper surface 5a of the semiconductor layer 5, and thus loss of the brightness performance due to the attachment is avoided.

A remainder after removing the substrate 1 from the chip 9 (and more specifically, from the structure 7) forms a light emitting element 9'. The removal of the substrate 1 exposes the upper surface 5a of the semiconductor layer 5, and the wall part 23a of the anisotropic conductive material 23 protrudes as compared to the semiconductor layer 5 exposed by the removal of the substrate 1 at the periphery of the semiconductor layer 5.

Figure 4A:
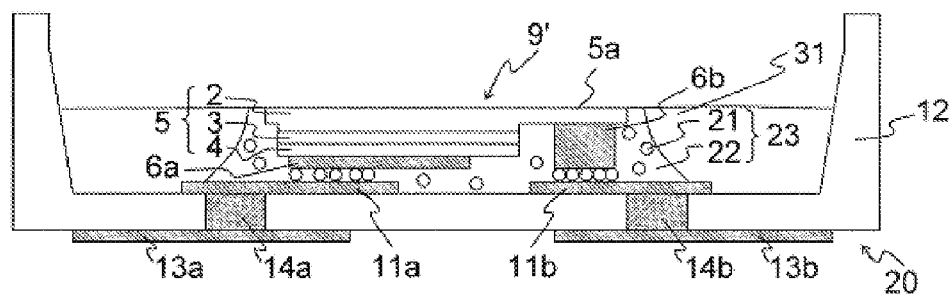
FIG. 4 shows schematic process steps for explaining the method for manufacturing a light emitting device according to the first embodiment, FIG. 4A showing the device with a wall part of the anisotropic conductive material removed, and FIG. 4B showing a phosphor layer formed on the upper surface of the semiconductor layer.

Next, in the first embodiment, as shown in FIG. 4A, the wall part 23a of the anisotropic conductive material 23 is removed. At this time, a part of the light reflector 31 positioned on the wall part 23a of the anisotropic conductive material 23 is removed together with the wall part 23a. Such removal can be conducted by any appropriate method, such as cutting machining, grinding, or the like. Thereby, the top part of the anisotropic conductive material 23 (and the light reflector 31) is substantially at the same level in height as the upper surface 5a of the semiconductor layer 5. If the wall part 23a of the anisotropic conductive material 23 remains, the light could be absorbed in the wall part 23a. In the first embodiment, however, the removal of the wall part 23a can suppress the absorption of the light, and thus can increase the brightness performance of the light emitting device finally obtained.

Figure 4B:
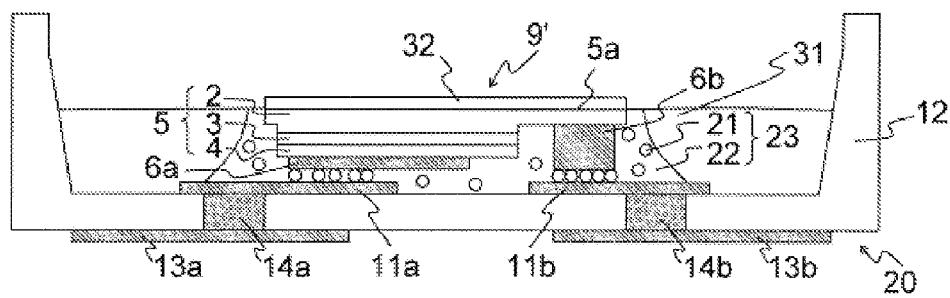

Thereafter, as shown in FIG. 4B, a phosphor layer 32 is formed on the upper surface 5a of the semiconductor layer 5. The formation of the phosphor layer 32 can be conducted by bonding a phosphor sheet (or phosphor plate, the same shall apply hereinafter) on the upper surface 5a of the semiconductor layer 5. The bonding may use an adhesive such as a silicone-based resin. The phosphor sheet is previously cut corresponding to the size of the upper surface 5a of the semiconductor layer 5, and may be of the same size or slightly larger size than the upper surface 5a of the semiconductor layer 5 so as to cover the entire upper surface 5a (not to expose the upper surface 5a) of the semiconductor layer 5. In the first embodiment, the wall part 23a of the anisotropic conductive material 23 (and the light reflector 31) is previously removed so that the top part thereof is at the same height as the upper surface 5a of the semiconductor layer 5. Thereby, even when the size of the phosphor sheet is equal to or larger than that of the upper surface of the semiconductor layer or the accuracy of alignment of the phosphor sheet is not high enough, the phosphor sheet is prevented from being hung up on the wall part 23a, and thus the phosphor sheet can be easily placed in intimate contact with the upper surface 5a of the semiconductor layer 5.

Alternatively, the formation of the phosphor layer 32 can be conducted by electrodepositing a phosphor film on the upper surface 5a of the semiconductor layer 5. The thus-obtained phosphor layer 32 has the same size as that of the upper surface 5a of the semiconductor layer 5, which can reduce the area of the light emitting device finally obtained, and can increase the brightness per unit area.

The formation of the phosphor layer 32 can change the color of light (chromaticity or color temperature) emitted from the light emitting device according to the composition of the phosphor contained in the phosphor layer 32. For example, in a case where blue light is generated from the semiconductor layer 5, white light can be obtained by using YAG (yttrium-aluminum-garnet) phosphor.

Figure 5:
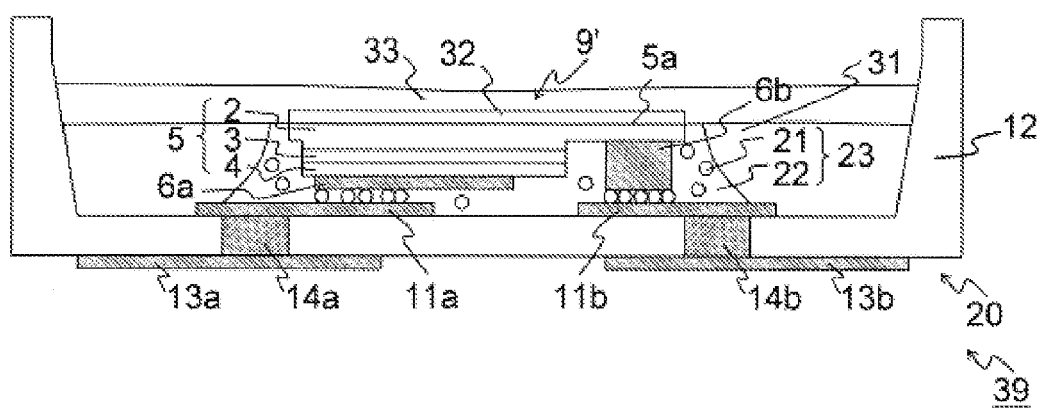
FIG. 5 shows a schematic process step for explaining the method for manufacturing a light emitting device according to the first embodiment, and more specifically, shows a third resin as a sealing resin supplied into a concave portion of a resin molded article.

Then, as shown in FIG. 5, a third resin as a sealing resin 33 is supplied into the concave portion of the resin molded article 12 (on the semiconductor layer 5 provided with the phosphor layer 32, and on the anisotropic conductive material 23, etc.) for sealing (molding). As the third resin, any curable resin by, for example, heat, light and/or humidity may be used. A silicone-based resin is preferably used from viewpoints of translucency, transparency, heat resistance, adhesion, and the like. Such sealing can be conducted by supplying the uncured third resin into the concave portion of the resin molded article 12 and curing it.

As described above, the light emitting device 39 of the first embodiment is manufactured. The light emitting device 39 comprises: the light emitting element 9' including the semiconductor layer 5, and the p-side electrode 6a and the n-side electrode 6b formed on the same side of the semiconductor layer 5; the support member 20 including the p-side wiring 11a and the n-side wiring 11b on the same surface; and an anisotropic conductive material 23 containing the conductive particles 21 and the first resin (binder resin 22). The p-side electrode 6a and the n-side electrode 6b of the chip 9' are electrically connected to the p-side wiring 11a and the n-side wiring 11b of the support member 20, respectively, by the anisotropic conductive material 23.

In the first embodiment, the light emitting element 9' is obtained by the removal of the substrate 1, and therefore the light emitting device 39 can be provided with the phosphor layer 32 disposed on the surface of the semiconductor layer 5 of the light emitting element 9' opposite to the surface on which the p-side electrode 6a and the n-side electrode 6b are formed. The peripheral edge part of the semiconductor layer 5 is in contact with the anisotropic conductive material 23, and the peripheral edge part of the phosphor layer 32 can be exposed from the anisotropic conductive material 23. Additionally, the light emitting device 39 can be further provided with the light reflector 31 which is disposed on the anisotropic conductive material 23 around the light emitting element 9' and has a higher reflectivity than the anisotropic conductive material 23.

According to the first embodiment, it becomes possible to manufacture a light emitting device 39 with high performance and high reliability, effectively (in a manner appropriate for mass production and cost-saving).

Particularly, according to the first embodiment, since the substrate 1 is removed in the light emitting device 39, the loss of light due to attenuation by reflection of the light within the substrate 1 can be avoided, and thereby high light extraction efficiency can be obtained. Furthermore, according to the first embodiment, the electrical connection between the electrodes 6a, 6b and the wirings 11a, 11b is ensured by the conductive particles 21 bonded therebetween under pressure. Therefore, even when the light emitting device 39 is exposed to change in temperature to cause the thermal stress due to the thermal expansion of the anisotropic conductive material 23 (particularly, the binder resin 22), the thermal stress can be relieved by the presence of the bonded conductive particles 21, so that the thermal stress applied to the semiconductor layer 5 can be reduced, and the thermal stress is uniformly applied to the whole of the semiconductor layer 5. As a result, although the strength of the semiconductor layer 5 is decreased (due to the removal of the substrate 1), breakage of the semiconductor layer 5 can be reduced or prevented, and therefore high reliability can be obtained.

Additionally, according to the first embodiment, the core of the conductive particles 21 of the anisotropic conductive material 23 is made of the second resin, and the composition of the anisotropic conductive material 23 is selected to express similar thermal expansion and contraction behavior between the inside and outside of the conductive particles 21, and is selected, more specifically, to have the ratio of the absolute value of the difference between the thermal expansion coefficient of the first resin and the second resin to the thermal expansion coefficient of the binder resin (second resin) of the anisotropic conductive material 23, and have the ratio of the absolute value of the difference between the thermal expansion coefficient of the second resin and the average thermal expansion coefficient of the material corresponding to the anisotropic conductive material 23 from which the conductive particles 21 are removed to the average thermal expansion coefficient, both within respectively pre-determined ranges. Thus, even when the light emitting device 39 is exposed to change in temperature, the thermal stress generated in the anisotropic conductive material 23, more specifically, a difference in thermal expansion between the conductive particles 21 and the binder resin 22 can be decreased, so that the break of the semiconductor layer 5 is further effectively reduced or prevented while the electrical connection via the conductive particles 21 is sufficiently maintained.

It shall be noted that in the conventional method anisotropic conductive materials are not used for mounting a light emitting element because the anisotropic conductive materials are colored and thus absorb light, and do not have good heat dissipation. In contrast, in the first embodiment, the light reflector 31 is formed to enhance brightness performance, and the filler having a relatively high heat conductivity is added to improve heat dissipation. However, it is noted that these are not essential to the present embodiment.

(Second Embodiment)

In a second embodiment, p-side and n-side electrodes of a light emitting element are electrically connected to p-side and n-side wirings of a support member, respectively, by anisotropic conductive material and bumps. Unless otherwise specified, similar descriptions as those in the first embodiment apply to this embodiment.

Figure 7A:
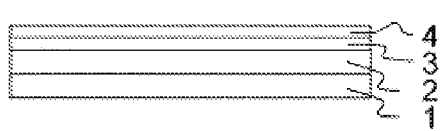
FIG. 7 shows schematic process steps for explaining a method for manufacturing a light emitting device according to a second embodiment, FIG. 7A showing an n-type semiconductor layer, an active layer, and a p-type semiconductor layer laminated on the substrate, FIG. 7B showing the p-type semiconductor layer, the active layer, and the n-type semiconductor layer partly removed by etching to expose the n-type semiconductor layer, FIG. 7C showing a p-side elec-trode formed on the p-type semiconductor layer, and an n-side electrode formed on the exposed n-type semiconductor layer, and FIG. 7D showing bumps formed on the p-side electrode and the n-side electrode.
Figure 7B:
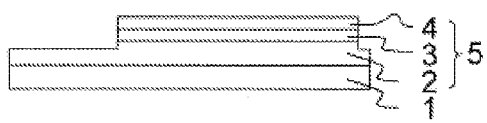
Figure 7C:
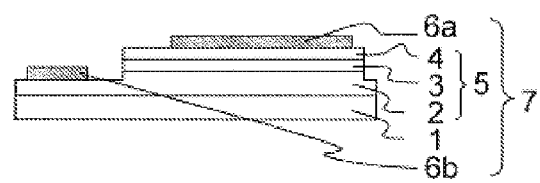

As shown in FIGS. 7A to 7C, a structure 7 which includes a substrate 1, a semiconductor layer 5, and a p-side electrode 6a and an n-side electrode 6b formed on the same side of the semiconductor layer 5 opposite to the substrate 1 is prepared in a similar manner as described in the above with reference to FIGS. 1A to 1C for the first embodiment.

Although it is not essential to the second embodiment, it is preferable to form a protective film on the p-side electrode 6a and the n-side electrode 6b, and to form openings in positions corresponding to bumps 8a and 8b which are described below, so that the p-side electrode 6a and the n-side electrode 6b are covered with the protective film (not shown) formed with the openings. The protective film may be a silicon oxide ($SiO_2$) film, or a multi-layer structured reflecting mirror (DBR: Distributed Bragg Reflector) such as a dielectric multi-layer structure. Such a protective film can protect the p-side electrode 6a and the n-side electrode 6b from scratches that might be caused during the steps (manufacturing process).

Figure 7D:
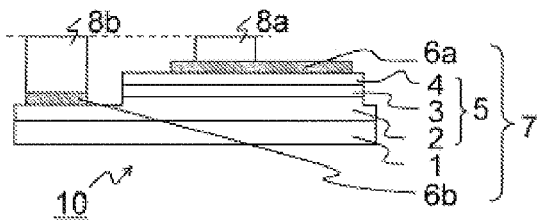

Then, as shown in FIG. 7D, the bumps 8a, 8b are formed on the p-side electrode 6a and the n-side electrode 6b. The bumps 8a, 8b are positioned on the p-side electrode 6a and the n-side electrode 6b in the above described openings of the protective film (not shown) so as to have tops of the bumps 8a, 8b protruding as compared to the protective film. As shown in the drawings, the tops of the bumps 8a, 8b are preferably positioned substantially at the same height (as indicated by a dotted line in the drawings) from a boundary surface between the substrate 1 and the semiconductor layer 5. The bumps 8a, 8b may be, for example, Au bumps.

Then, a light emitting element chip (dice) 10 is obtained by appropriately cutting the structure into a predetermined size (see FIG. 7D). The tops of the bumps 8a, 8b are preferably positioned substantially at the same height. Thereby, upon mounting the chip 10 on a support member 20 as described below, a pressure is uniformly applied to the entire chip 10, so that bonding inclination of the chip 10 can be suppressed.

As described above, there is manufactured the chip 10 provided with the structure 7 including the substrate 1, the semiconductor layer 5 formed on the substrate 1, and the p-side electrode 6a and the n-side electrode 6b formed on the same side of the semiconductor layer 5 opposite to the substrate 1, and additionally provided with the bumps 8a, 8b. The chip 10 is generally a light-emitting diode. Materials, shapes, and forming methods of each of the constituent members of the chip 10 can be changed, as appropriate.

Figure 8A:
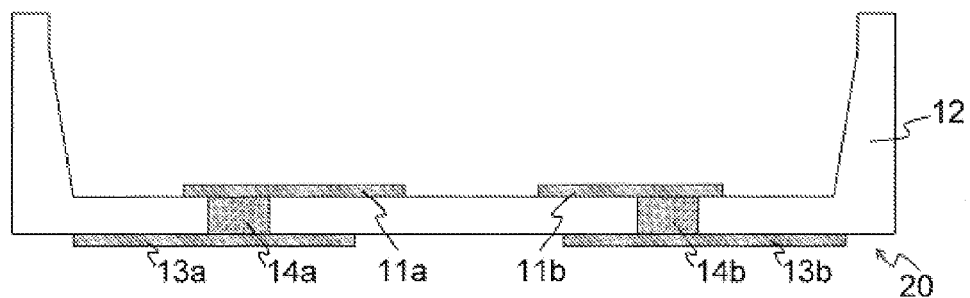
FIG. 8 shows schematic process steps for explaining the method for manufacturing a light emitting device according to the second embodiment, FIG. 8A showing a support member including a p-side wiring and an n-side wiring on the same surface, and FIG. 8B showing the anisotropic conductive material filling the space between the chip and the support member.

On the other hand, as shown in FIG. 8A, a support member 20 including a p-side wiring 11a and an n-side wiring 11b on the same surface is prepared in a similar manner as described in the above with reference to FIG. 2A for the first embodiment.

Then, an anisotropic conductive material 23 is supplied onto the bottom of the concave portion of the support member 20. The anisotropic conductive material 23 may be the same as that of the first embodiment.

Figure 8B:
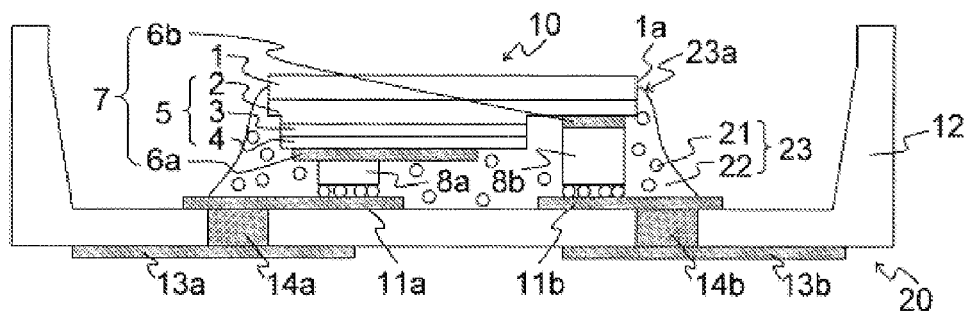

The supply amount and the viscosity of the anisotropic conductive material 23 can be adjusted so as to bring about the state described below with reference to FIG. 8B.

The chip 10 shown in FIG. 7D is reversed from top to bottom and placed on the anisotropic conductive material 23, which is supplied onto the bottom of the concave portion of the support member 20 as mentioned in the above, while being aligned with respect to the support member 20, and then it is pressed and heated. Thereby, as shown in FIG. 8B, the anisotropic conductive material 23 fills the space between the chip 10 (more specifically, the above structure, the same shall apply hereinafter) and the support member 20, and also mechanically (or physically) bonds the chip 10 to the support member 20 by curing the binder resin 22 in a state where the anisotropic conductive material 23 at least partly in contact with the side surfaces 1a of the substrate 1 of the chip 10 at its wall part 23a. Further, at this time, the conductive particles 21 in the anisotropic conductive material 23 are bonded while being pressed between the bumps 8a, 8b and the wirings 11a, 11b to thereby electrically connecting them, respectively. As a result, the p-side electrode 6a and the n-side electrode 6b of the chip 10 (more specifically, the structure 7) are electrically connected to the p-side wiring 11a and the n-side wiring 11b of the support member 20, respectively, by the anisotropic conductive material 23 (containing the conductive particles 21 and the first resin 22) and the bumps 8a, 8b.

In the second embodiment, the chip 10 is provided on the support member 20 via the anisotropic conductive material 23 with respect to the entire chip 10, so that the chip 10 is not influenced by a difference in thermal expansion coefficient between the bumps 8a, 8b and the anisotropic conductive material 23, which can prevent cracking in the semiconductor layer 5. In the second embodiment, since the bumps 8a, 8b are formed on the p-side electrode 6a and the n-side electrode 6b, respectively, the chip 10 can be easily aligned and placed on the support member 20, although the present invention is not limited thereto.

Figure 9A:
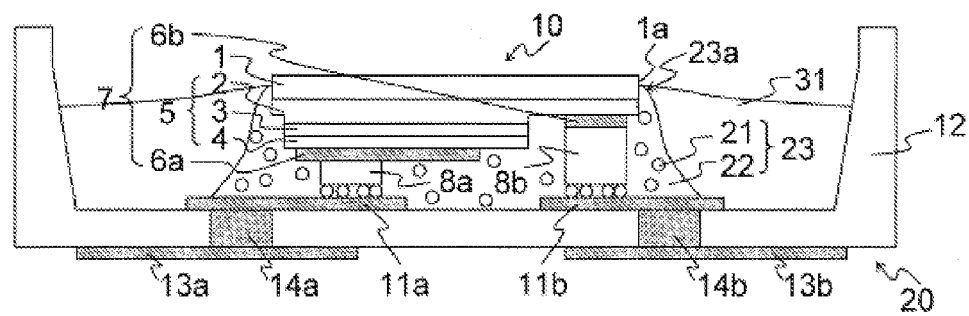
FIG. 9 shows schematic process steps for explaining the method for manufacturing a light emitting device according to the second embodiment, FIG. 9A showing a light reflector formed on the anisotropic conductive material so as to surround the chip, and FIG. 9B showing the device with the substrate removed from the chip.
Figure 9B:
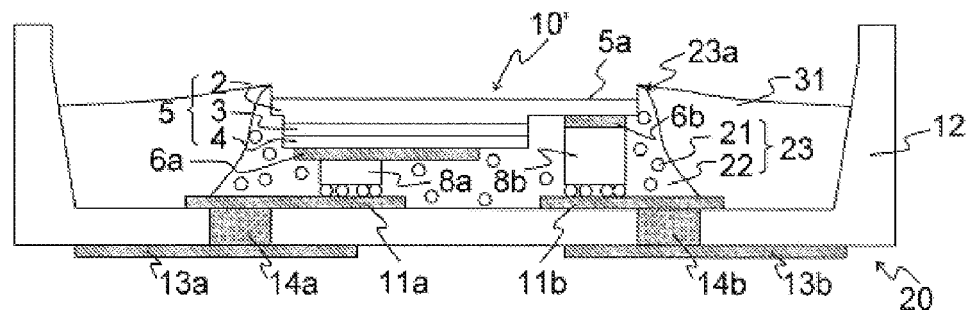

Then, as shown in FIG. 9A, a light reflector 31 having a higher reflectivity than the anisotropic conductive material 23 is formed on the anisotropic conductive material 23 so as to surround the chip 10. After that, as shown in FIG. 9B, the substrate 1 is removed from the chip 10. A remainder after removing the substrate 1 from the chip 10 (and more specifically, from the structure 7) forms a light emitting element 10'.

Figure 10A:
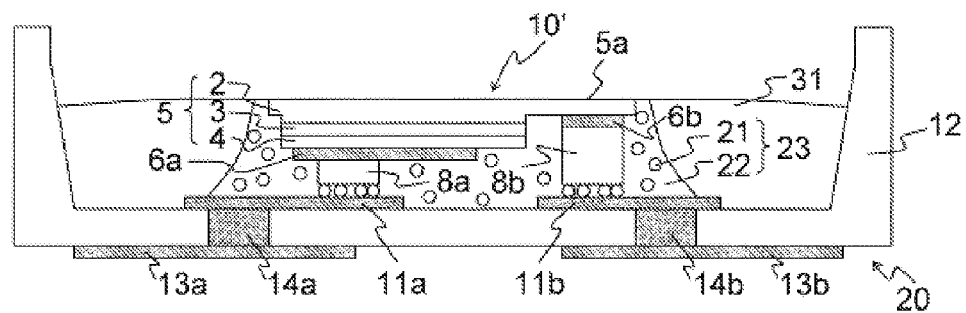
FIG. 10 shows schematic process steps for explaining the method for manufacturing a light emitting device according to the second embodiment, FIG. 10A showing the device with a wall part of the anisotropic conductive material removed, and FIG. 10B showing a phosphor layer formed on the upper surface of the semiconductor layer.
Figure 10B:
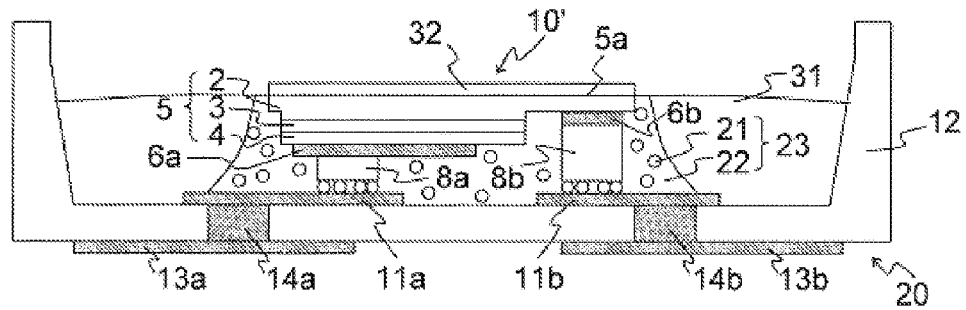

Next, also in the second embodiment, as shown in FIG. 10A, the wall part 23a of the anisotropic conductive material 23 is removed. Thereafter, as shown in FIG. 10B, a phosphor layer 32 is formed on the upper surface 5a of the semiconductor layer 5.

Figure 11:
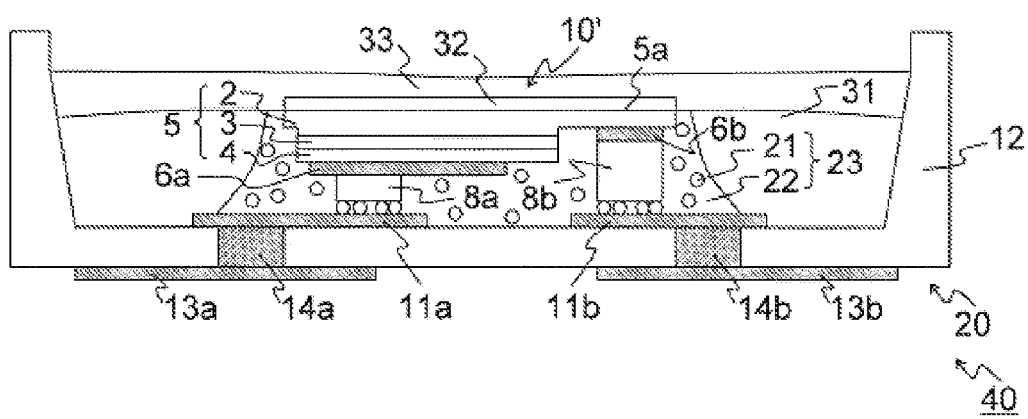
FIG. 11 shows a schematic process step for explaining the method for manufacturing a light emitting device according to the second embodiment, and more specifically, shows a third resin as a sealing resin supplied into the concave portion of a resin molded article.

Then, as shown in FIG. 11, a third resin as a sealing resin 33 is supplied into the concave portion of the resin molded article 12 (on the semiconductor layer 5 provided with the phosphor layer 32, and on the anisotropic conductive material 23, etc.) for sealing (molding).

As described above, the light emitting device 40 of the second embodiment is manufactured. The light emitting device 40 comprises: the light emitting element 10' including the semiconductor layer 5, and the p-side electrode 6a and the n-side electrode 6b formed on the same side of the semiconductor layer 5; the support member 20 including the p-side wiring 11a and the n-side wiring 11b on the same surface; and the bumps 8a, 8b formed on the p-side electrode and the n-side electrode of the light emitting element 10'. The p-side electrode 6a and the n-side electrode 6b of the chip 10' are electrically connected to the p-side wiring 11a and the n-side wiring 11b of the support member 20, respectively, by the anisotropic conductive material 23 containing the conductive particles 21 and the first resin (binder resin 22) and the bumps 8a, 8b.

In the second embodiment, the light emitting element 10' is obtained by the removal of the substrate 1, and therefore the light emitting device 40 can be provided with the phosphor layer 32 disposed on the surface of the semiconductor layer 5 of the light emitting element 10' opposite to the surface on which the p-side electrode 6a and the n-side electrode 6b are formed. The peripheral edge part of the semiconductor layer 5 is in contact with the anisotropic conductive material 23, and the peripheral edge part of the phosphor layer 32 can be exposed from the anisotropic conductive material 23. Additionally, the light emitting device 40 can be further provided with the light reflector 31 which is disposed on the anisotropic conductive material 23 around the light emitting element 10' and has a higher reflectivity than the anisotropic conductive material 23.

According to the second embodiment, it becomes possible to manufacture the light emitting device 40 with high performance and high reliability, effectively (in a manner appropriate for mass production and cost-saving).

Particularly, according to the second embodiment, since the substrate 1 is removed in the light emitting device 40 similarly to the first embodiment, the loss of light due to attenuation by reflection of the light within the substrate 1 can be avoided, and thereby the high light extraction efficiency can be obtained. Furthermore, according to the second embodiment, the electrical connection between the bumps 8a, 8b and the wirings 11a, 11b is ensured by the conductive particles 21 bonded therebetween under pressure. Therefore, even when the light emitting device 40 is exposed to change in temperature to cause difference in thermal expansion between the bumps 8a, 8b and the anisotropic conductive material 23 (particularly, the binder resin 22), the thermal stress can be relieved by the presence of the bonded conductive particles 21, so that the thermal stress applied to the semiconductor layer 5 can be reduced. As a result, although the strength of the semiconductor layer 5 is decreased (due to the removal of the substrate 1), breakage of the semiconductor layer 5 can be reduced or prevented, and therefore high reliability can be obtained.

In other respects, the second embodiment can also obtain the similar effects as those of the first embodiment.

(Third Embodiment)

A third embodiment is substantially the same as the second embodiment except that a wall part 23a of anisotropic conductive material 23 is not removed. More specifically, this embodiment will be conducted as described below.

A method for manufacturing a light emitting device in the third embodiment is similar to that in the second embodiment until the substrate 1 is removed from the chip 10 as shown in FIG. 9B. The removal of the substrate 1 exposes the upper surface 5a of the semiconductor layer 5, and the wall part 23a of the anisotropic conductive material 23 protrudes as compared to the semiconductor layer 5 exposed by the removal of the substrate 1 at the periphery of the semiconductor layer 5.

Figure 12A:
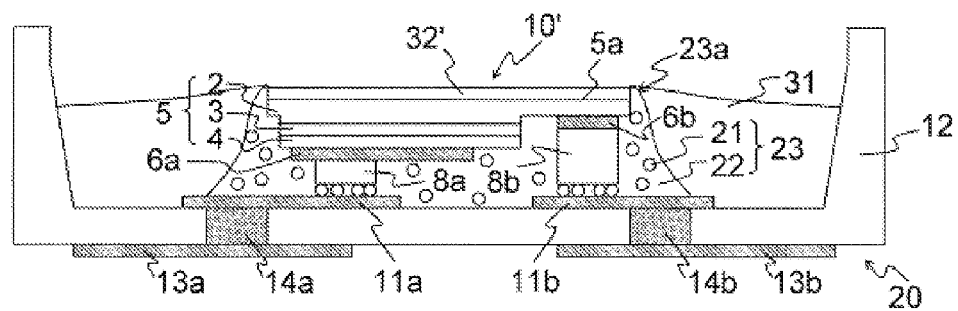
FIG. 12 shows schematic process steps for explaining a method for manufacturing a light emitting device according to a third embodiment, FIG. 12 A showing a phosphor layer formed on the upper surface of the semiconductor layer, and FIG. 12B showing a third resin as a sealing resin supplied into the concave portion of a resin molded article.

Thereafter, as shown in FIG. 12A, a phosphor layer 32' is formed on the upper surface 5a of the semiconductor layer 5. More specifically, the formation of the phosphor layer 32' can be conducted by supplying (potting) a phosphor containing resin (for example, material of the uncured silicone-based resin and phosphor particles dispersed therein) into a recessed portion (or cup) on the semiconductor layer 5 surrounded by the wall part 23a of the anisotropic conductive material 23, and by curing the phosphor containing resin.

Figure 12B:
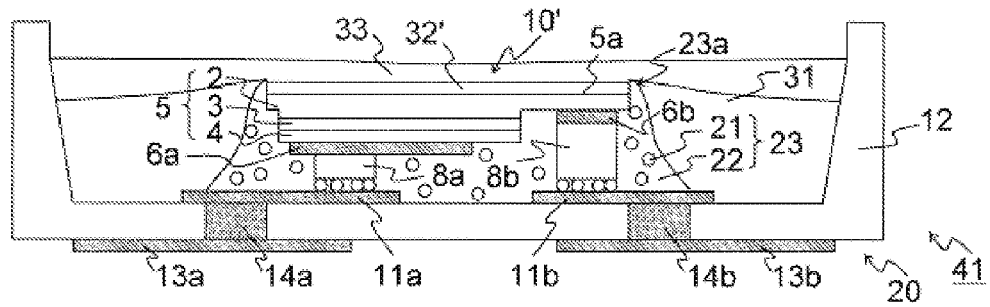

Then, similarly to the second embodiment, as shown in FIG. 12B, a third resin as a sealing resin 33 is supplied into the concave portion of the resin molded article 12 (on the semiconductor layer 5 provided with the phosphor layer 32', and on the anisotropic conductive material 23, etc.) for sealing (molding).

As described in the above, the light emitting device 41 of the third embodiment is manufactured. The light emitting device 41 comprises the phosphor layer 32' disposed on the surface of the semiconductor layer 5 of the light emitting element 10' opposite to the surface on which the p-side electrode 6a and the n-side electrode 6b are formed, and is different from the light emitting device 40 of the second embodiment in that the peripheral edge part of the phosphor layer 32' as well as the peripheral edge part of the semiconductor layer 5 is in contact with the anisotropic conductive material 23.

According to the third embodiment, the wall part 23a of the anisotropic conductive material 23 (and the light reflector 31) is not removed, and the phosphor layer 32' can be easily disposed on and in intimate contact with the upper surface 5a of the semiconductor layer 5 by using the wall part 23a. The thus-formed phosphor layer 32' has the same size as that of the upper surface 5a of the semiconductor layer 5, which can reduce the area of the light emitting device finally obtained, and thereby increase the brightness per unit area. That is, according to the third embodiment, there is provided the light emitting device 41 in which the anisotropic conductive material 23 disposed at least partly in contact with the side surface of the phosphor layer 32' while filling the space between the light emitting element 10' and the support member 20.

In other respects, this embodiment can also obtain the similar effects as those of the second embodiment.

The three preferred embodiments relating to the one aspect of the present invention have been described above, but the present invention is not limited to those embodiments and can be made with various modifications. For example, the conductive particles contained in the anisotropic conductive material may be formed of a conductive material only. For example, regarding second and the third embodiments, the followings are possible: the bumps 8a, 8b can be formed on the p-side wiring 11a and the n-side wiring 11b of the support member 20; the conductive particles 21 in the anisotropic conductive material 23 can be bonded while being pressed between the bumps 8a, 8b and the electrodes 6a, 6b to thereby electrically connecting them, respectively; and as a result, the p-side electrode 6a and the n-side electrode 6b of the chip 10 (more specifically, the structure 7) can be electrically connected to the p-side wiring 11a and the n-side wiring 11b of the support member 20, respectively, by the anisotropic conductive material 23 containing the conductive particles 21 and the first resin 22 via the bumps 8a, 8b. Further, the first embodiment can be modified in a similar manner to the modification by the third embodiment from the second embodiment.

(Fourth Embodiment)

Figure 13:
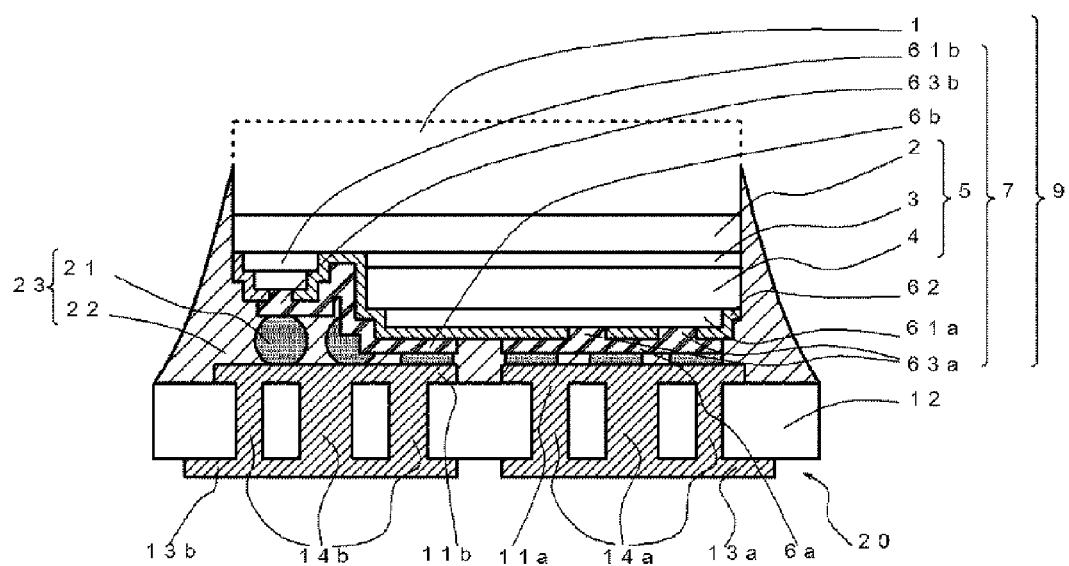
FIG. 13 shows a cross-sectional view for explaining a light emitting device according to a fourth embodiment, and more specifically, shows a device in which a plurality of layers forming an insulating layer, a conductive member, and electrodes are formed on a semiconductor layer so as to overlap with each other.

In a fourth embodiment, as shown in FIG. 13, a structure 7 of a light emitting element 9' includes a semiconductor layer 5 including a first semiconductor layer 2, an active layer 3, and a second semiconductor layer 4; an insulating layer 62 formed on the second semiconductor layer; an n-side electrode 6b formed on the insulating layer 62 to overlap with the second semiconductor layer 4 and electrically connected to the first semiconductor layer 2; a p-side electrode 6a electrically connected to the second semiconductor layer 4: wherein the p-side electrode 6a and the n-side electrode 6b of the light emitting element 9' are electrically connected to a p-side wiring 11a and an n-side wiring 11b of a support member 20 provided with a base 12 by an anisotropic conductive material 23 containing conductive particles 21 and a binder resin 22. Then, a substrate 1 is removed from the semiconductor layer 5.

The light emitting device of the fourth embodiment can be manufactured in the following manner.

First, as shown in FIGS. 14A to 14F, there is prepared the structure 7 which includes a substrate, a first semiconductor layer, a second semiconductor layer, an insulating layer formed on the second semiconductor layer, an n-side electrode formed on the insulating layer to overlap with the second semiconductor layer and electrically connected to the first semiconductor layer, a p-side electrode electrically connected to the second semiconductor layer.

Figure 14A:
FIG. 14 shows schematic process steps for explaining a method for manufacturing the light emitting device according to the fourth embodiment, FIG. 14A showing an n-type semiconductor layer, an active layer, and a p-type semiconductor layer laminated on a substrate, FIG. 14B showing the p-type semiconductor layer, the active layer, and the n-type semiconductor layer partly removed by etching to expose the n-type semiconductor layer, FIG. 14C showing a p-side conductive member and an n-side conductive member formed on the p-type semiconductor layer and on the n-type semiconductor layer, respectively, FIG. 14D showing an insulating layer formed to cover the p-side conductive member, the n-side conductive member, and the semiconductor layer, FIG. 14E showing a plurality of through holes formed in the insulating layer to expose at least a part of each of the p-side conductive member and the n-side conductive member, and FIG. 14F showing a light emitting element chip obtained by appropriately cutting the structure into a predetermined size.
Figure 14B:
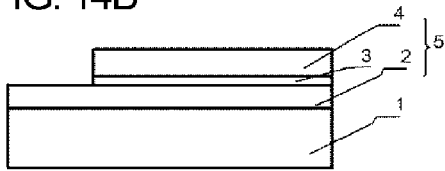
Figure 14C:
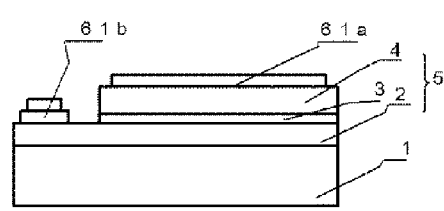
Figure 14D:
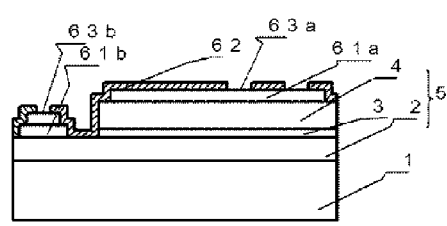
Figure 14E:
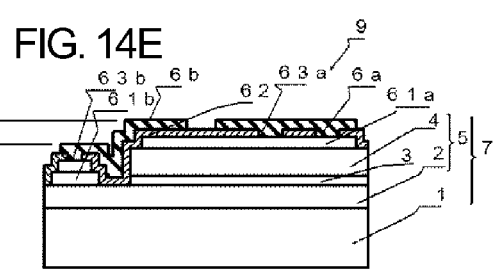

More specifically, as shown in FIG. 14A, at least an n-type semiconductor layer 2 as the first semiconductor layer, an active layer 3, and a p-type semiconductor layer 4 as the second semiconductor layer are laminated on the substrate (substrate for growth) 1 in this order to thereby form the semiconductor layer containing these layer (sub-layers). The semiconductor layer may contain a buffer layer, a contact layer and the like, as appropriate. Typically, a sapphire substrate can be used as the substrate 1, and the n-type semiconductor layer 2, the active layer 3, and the p-type semiconductor layer 4 can be composed of a nitride semiconductor. Then, as shown in FIG. 14B, the p-type semiconductor layer 4, the active layer 3, and the n-type semiconductor layer 2 are partly removed by etching to expose the n-type semiconductor layer 2, and thereby the semiconductor layer (laminate) 5 is obtained. Thereafter, as shown in FIG. 14C, a p-side conductive member 61a and an n-side conductive member 61b are formed on the p-type semiconductor layer 4 as the top layer and on the n-type semiconductor layer 2, respectively. Next, as shown in FIG. 14D, an insulating layer 62 is formed to cover the p-side conductive member 61a and the n-side conductive member and the semiconductor layer 5. Then, as shown in FIG. 14E, a plurality of through holes 63a, 63b are formed in the insulating layer 62 to expose at least a part of each of the p-side conductive member 61 and the n-side conductive member, respectively. On the insulating layer, a p-side electrode 6a connected to the p-side conductive member 61a in the through hole 63a and an n-side electrode 6b also serving as a metal member connected to the n-side conductive member 61b in the through hole 63b are formed. At this time, the n-side electrode 6b partly overlaps with the p-type semiconductor layer 4 while the insulating layer 62 is disposed therebetween. More specifically, the n-side electrode 6b is formed to extend over the n-type semiconductor layer 2, the end surface of the active layer 3 and the p-type semiconductor layer 4 in the vicinity of the exposed part of the n-type semiconductor layer 2, and the p-type semiconductor layer.

As described above, since a plurality of layers forming the insulating layer, the conductive member, and the electrodes are formed on and the semiconductor layer 5 overlapping with each other, the strength of the light emitting element can be improved. Specifically, the metal member (n-side electrode 6b in the fourth embodiment) is formed extending from an area above the n-type semiconductor layer 2 and overlapping with an area above the p-type semiconductor layer 4 to cover the exposed part of the n-type semiconductor layer 2, which is relatively thin and has a low strength in the light emitting element, and thereby the part which tends to crack can be reinforced effectively. This can prevent the cracking in the semiconductor layer upon removal of the substrate described below or in use of the completed light emitting device, and can provide the light emitting device with excellent mass productivity and reliability.

The p-side conductive member 61a may be a reflective electrode containing Ag, and the n-side conductive member 61b may be a reflective electrode containing Al. As the p-side conductive member 61a and the n-side conductive member 61b, a translucent electrode such as ITO may be formed, if preferable.

The metal member (member 6b in the fourth embodiment) is formed to extend from the first semiconductor layer (n-type semiconductor layer 2) to the second semiconductor layer (p-type semiconductor layer) and overlap with them on the opposite surface to the substrate 1 (that is, the surface on the second semiconductor layer side). The material and shape of the metal member is not specifically limited as long as the member can reinforce the exposed part of the n-type semiconductor layer 2 of the semiconductor layer 5. Since the metal member is formed to overlap with the two semiconductor layers of different polarities, the metal member is preferably formed on the insulating layer (insulating layer 62 in the fourth embodiment). The metal member is preferably integral with the p-side electrode 6a and the n-side electrode 6b described below. The electrode used for mounting the chip 9 is relatively thicker than other members of the light emitting element 9'. Such a thick electrode is used as the metal member for reinforcement, so that the strength of the light emitting element 9' can be increased readily. Particularly, the metal member is preferably integral with the n-side electrode 6b electrically connected to the first semiconductor layer 2. Additionally, the metal member may be integral with the p-side conductive member 61a and/or the n-side conductive member 61b. Further, the metal member may be disposed between two insulating layers.

The insulating layer 62 is a layer for insulating the metal member from the first semiconductor layer 2 and/or the second semiconductor layer 4. Material for the insulating layer is preferably an oxide or a nitride of at least one selected from the group consisting of Si, Ti, Zr, Nb, Ta, and Al. A DBR (distributed Bragg reflector) wherein such layers are laminated can be used. The DBR is a multi-layered structure of a plurality of sets of dielectrics, each set consisting of a low reflective index layer and a high reflective index layer to selectively reflect a light having a predetermined wavelength. Specifically, layers with different reflective indexes are laminated alternately, each layer having a thickness of ¼ wavelength, so that the light having the predetermined wavelength can be reflected effectively. In the fourth embodiment, it is preferable to apply the DBR capable of reflecting a light with a wavelength emitted from the light emitting element. The formation of the insulating layer can be conducted by sputtering, vapor deposition, ALD, and the like.

Materials for the p-side electrode 6a and the n-side electrode 6b are not specifically limited as long as the electrode can be electrically connected to the wiring of the support member by the anisotropic conductive material described below. For the materials, metals such as Au, Ag, Pt, Al, Rh, W, Ti, Ni, Pd, Cu, and the like, and preferably Au can be used. These metals may be used either in the form of a single layer, or in the form of a laminate of a plurality of the metals. When the insulating layer 62 has light permeability, at least the surface in contact with the insulating layer 62 is preferably formed of material having a high optical reflectivity. This can reflect the light passing through the insulating layer 62, so that the light emitting device can be obtained with high light extraction efficiency.

The p-side electrode 6a and the n-side electrode 6b are preferably formed substantially in the same shape and area in the planar view. Therefore, the structure can be stably mounted.

In some cases, the n-side electrode 6b and the p-side electrode 6a may have a difference in height between respective electrode surfaces opposed to the support member 20 due to a difference in height between the n-type semiconductor layer 2 and the p-type semiconductor layer 4 (from a boundary between the substrate 1 and the semiconductor layer 5). This difference in height between the n-side electrode 6b and the p-side electrode 6a is preferably smaller than the difference in height between the n-type semiconductor layer 2 and the p-type semiconductor layer 4. Thereby, the mounting with the anisotropic conductive material 23 can be conducted easier. Such arrangement is obtained, for example, by forming the n-side electrode 6b more thickly than the p-side electrode 6a, or by forming the insulating layer 62 more thickly under the n-side electrode 6b rather than under the p-side electrode 6a, or by forming two or more layers of the n-side conductive members 61b more thickly than the p-side conductive member 61a as in the fourth embodiment.

Figure 18A:
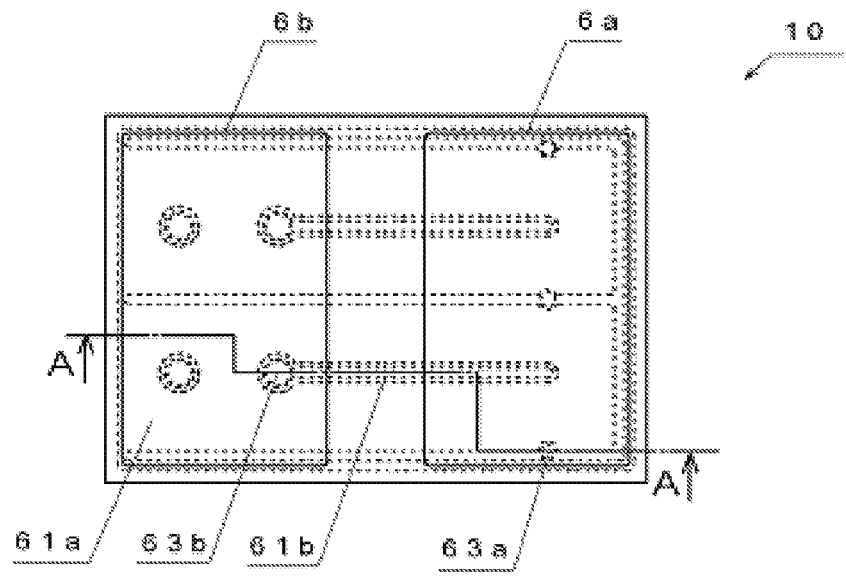
FIG. 18 shows views for explaining an example of a structure usable according to the fourth embodiment, FIG. 18A showing a schematic plan view of the structure, and FIG. 18B showing a schematic cross-sectional view of the structure taken along the line A-A of FIG. 18A.

Although the exposed part of the n-type semiconductor layer 2 is positioned at the edge of the structure 7 in FIG. 14, the present invention is not limited thereto. For example, as shown in FIG. 18A, in the planar view, the exposed part of the n-type semiconductor layer 2 may be formed inside or at the center part of the structure 7 so as to be surrounded by the p-type semiconductor layer 4. A plurality of exposed parts of the n-type semiconductor layer may be formed. Thus, current constriction within the light emitting element 9' can be reduced, so that the light emitting device can be obtained with high light emitting efficiency. Further, the light emitting distribution of the light emitting element 9' can be made uniform.

Figure 18B:
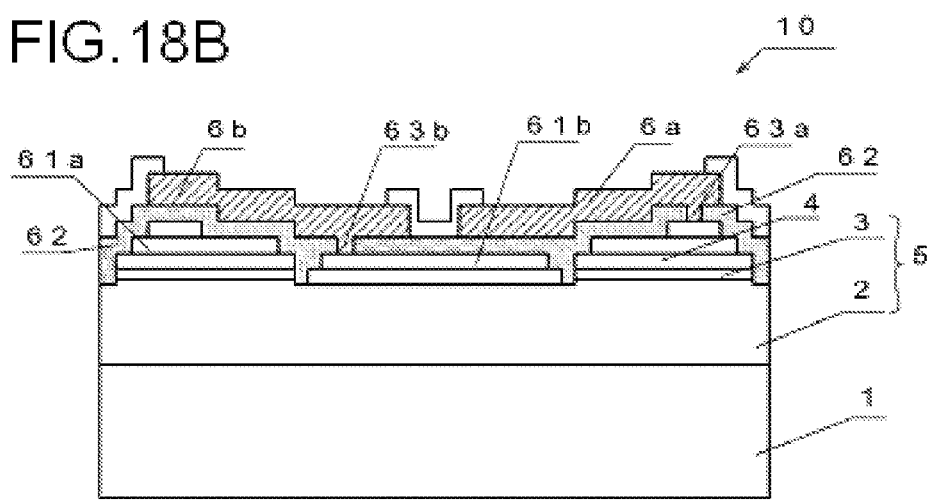

Although the p-side electrode 6a is formed to overlap with only the p-type semiconductor layer 4 in FIG. 14, the p-side electrode 6a may be formed to overlap with the exposed part of the n-type semiconductor layer 2 while disposing the insulating layer 62 therebetween as shown in FIG. 18B, and thereby function as a metal member for reinforcing the semiconductor layer 5. Thus, the exposed part of the n-type semiconductor layer 2 under the p-side electrode 6a can be reinforced.

Figure 14F:
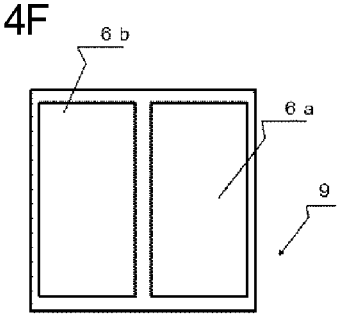

Then, a light emitting element chip (dice) 9 is obtained by appropriately cutting the structure into a predetermined size (see FIG. 14F).

As described in the above, there is manufactured the chip 9 provided with the substrate, the first semiconductor layer and the second semiconductor layer formed thereon in this order, the insulating layer formed on the second semiconductor layer, the n-side electrode, which doubles as the metal member, formed on the insulating layer to overlap with the second semiconductor layer and electrically connected with the first semiconductor layer, and the p-side electrode electrically connected to the second semiconductor layer. The chip 9 is generally a light-emitting diode. Materials, shapes, and forming methods of each of the constituent members of the chip 9 can be changed, as appropriate.

Figure 15A:
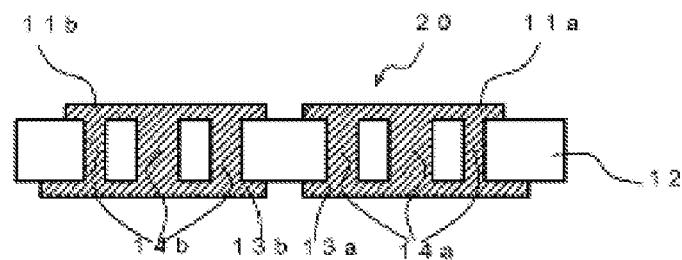
FIG. 15 shows schematic process steps for explaining the method for manufacturing a light emitting device according to the fourth embodiment, FIG. 15A showing a support member including a p-side wiring and an n-side wiring on the same surface, FIG. 15B showing an anisotropic conductive material in the form of a liquid supplied on the p-side wiring and the n-side wiring of the support member, and FIG. 15C showing a chip on the anisotropic conductive material while being pressed and heated by a heat tool.

On the other hand, as shown in FIG. 15A, a support member 20 including a p-side wiring 11a and an n-side wiring 11b on the same surface is prepared.

In the embodiment shown in the drawings, the support member 20 includes the p-side wiring 11a and the n-side wiring 11b formed on the upper surface of the support member, leads 13a and 13b formed on the bottom surface opposed to the upper surface of the support member, and vias 14a and 14b made of a conductive material for electrical connection between them.

The base 12 of the support member 20 supporting the p-side wiring 11a and the n-side wiring 11b may be formed of any material, for example, resins such as epoxy resin, a silicone-based resin, PPA, and so on, aluminum nitride (AlN), single crystal, polycrystal, a sintered substrate, and other materials, including ceramic such as alumina, glass, semi-metal such as Si, or a metal substrate, or a lamination or composition thereof. Particularly, ceramic can enhance the reliability in laser irradiation described below, since it is hard to be deformed by heat or the like. When the light extraction efficiency is increased by, for example, making the anisotropic conductive material 23 contain a light reflective material described below, it is possible to use a ceramic based material of low optical reflectivity but high reliability, an inexpensive black epoxy-based resin base, and the like for the material of the support member 20.

The support member 20 is preferably a flat plate without any concave portion as show in FIG. 15. Thus, in curing the anisotropic conductive material 23, the chip 9 can be easily brought into contact with a heat tool 24, so that mass productivity is increased.

The support member 20 may have a concave portion for containing the light emitting element or chip 9. In this case, the anisotropic conductive material 23 can be cured by using the heat tool 24 which has a protrude portion formed to contact with the chip 9 within the concave portion. The concave portion may be formed by attaching a frame surrounding the light emitting element or chip 9 after the chip 9 is mounted on the plate-like support member 20.

In the fourth embodiment, it is also possible not to form the support member 20. For example, a method is presented for mounting the chip 9 on the p-side wiring 11a and n-side wiring 11b in the form of a lead frame having a flat surface on its upper surface. In this case, the space between the p-side wiring 11a and the n-side wiring 11b may be filled with either the anisotropic conductive material 23, or a sealing member described below.

Additionally, the support member 20 may have various electric functions. For example, a zener diode or a varistor element is used as the support member, so that an electrostatic breakdown voltage of the light emitting device can be increased.

The support member 20 includes the p-side wiring 11a and the n-side wiring 11b on the same side, which are connected to the electrodes of the chip 9 via the conductive particles 21.

Material for the wirings is not specifically limited as long as the material has conductivity, and, for example, Au or silver-white metals, more preferably Ag, Al, and the like which has a high reflectivity may be used. It is preferable to use silver-white metal of a high reflectivity, since the light emitted from the light emitting element is reflected in the direction opposite to the support member, and thereby high light extraction efficiency of the light emitting device is increased. When the light extraction efficiency is increased by, for example, making the anisotropic conductive material 23 contain a light reflective material describe below, it is possible to use Au which has lower optical reflectivity than Ag etc., but show high connection reliability with the conductive particles. As such wiring, more specifically, it is possible to use, for example, an Au layer having a thickness of 10 to 50 μm formed on a Ti layer having a thickness of 10 nm. Other than Ti/Au, it is also possible to use Ni/Au, Al/Au or the like.

The leads 13a, 13b are formed at the bottom of the support member 20 and serve as an external terminal of the light emitting device. A material thereof is not specifically limited as long as having conductivity, but is preferably a material having a good wettability of a solder or the like used for mounting the light emitting device, and, for example, Au, Ag or the like can be used.

In the fourth embodiment, the leads 13a, 13b are formed at the bottom side of the support member 20, but are not limited thereto, and may be provided on the upper surface side or lateral surface side of the support member. When the leads 13a, 13b are formed at the lateral surface side of the support member 20, the light emitting device of side emission type is obtained.

The vias 14a, 14b are formed to penetrate the support member 20 and to electrically connect the wirings 11a, 11b on the upper surface of the support member 20 to the leads 13a, 13b on the bottom surface.

A material thereof is not specifically limited as long as having conductivity, but is preferably a material having excellent conductivity and heat dissipation, and, for example, Cu or the like can be used.

It is preferable to prepare the support member 20 in the form of a collective substrate wherein a plurality of the support members are connected together. Thereby, the anisotropic conductive material on a plurality of the support members can be cured by one heat tool at one time to mount a plurality of chips by one operation, so that mass productivity can be increased. Additionally, in the step of removing the substrate described below, the tact can be improved, so that mass productivity can be increased. After the curing step, the support members in the form of the collective substrate can be divided by cutting or the like into pieces, so that the individual light emitting devices are obtained.

Figure 15B:
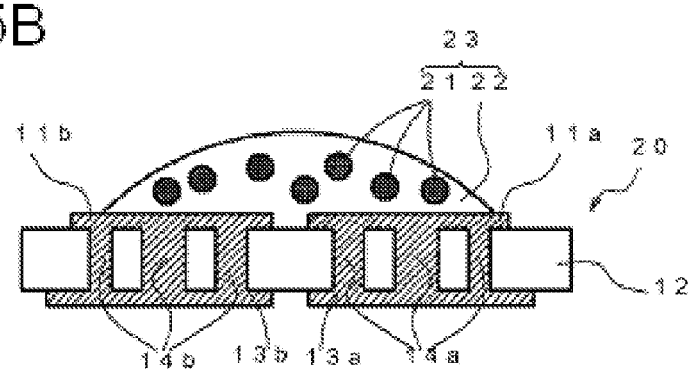

Then, as show in FIG. 15B, the anisotropic conductive material 23 in the form of a liquid is supplied on the p-side wiring 11a and the n-side wiring 11b of the support member 20 by dispensing it. The anisotropic conductive material 23 contains a first resin as a binder resin 22, conductive particles 21 dispersed in the binder resin (first resin) 22, and $TiO_2$ as the light reflective material. In the fourth embodiment, as shown in FIG. 6, the conductive particles 21 a core 21a made of a second resin, and a conductive layer 21b covering the core 21a and made of metal. The composition of the anisotropic conductive material 23 (content ratio of each of the binder resin 22, the conductive particles 21, and other components if present), the average particle size of the conductive particles 21, the thickness of the conductive layer 21b and the like can be selected, as appropriate. The particle size of the conductive particles 21 is preferably smaller than the sum of the thickness of the electrode close to the support member 20 (specifically the p-side electrode 6a), and the thickness of the wiring connected to this electrode (specifically, the p-side wiring 11a).

Specifically, this can be achieved by setting the particle size of the conductive particles 21 smaller than the thickness of each of the p-side wiring 11a and the n-side wiring 11b, or the thickness of each of the p-side electrode 6a and the n-side electrode 6b on the insulating layer 62. Thereby, the conductive particles 21 can be prevented from being pressed and providing electrical connection at a unnecessary part, e.g. between wirings.

As the anisotropic conductive material 23, in addition to an anisotropic conductive paste (ACP) which is in the form of a liquid before curing, a film-like anisotropic conducive film (ACF) can be used. When the anisotropic conductive paste is used, it can be supplied on the support member by dispensing or printing.

The first resin as the binder resin 22 is, for example, a thermosetting resin such as epoxy resin, a silicone resin, or a hybrid silicone resin, and may be mixed with a thermoplastic resin or the like in some cases. The silicone resin and the hybrid silicone resin can be preferably used because of high light resistance, and heat resistance. The second resin forming the core 21a of the conductive particles 21 may be any appropriate resin, for example, methacrylic resin.

The conductive layer 21b of the conductive particles 21 is made of metal, for example, Au, Ni, and the like. The conductive layer 21b can be formed on the surface of the core 21a made of the second resin by, for example, performing electroless plating, electroplating, mechano-fusion (mechanochemical reaction), or the like. The content of the conductive particles 21 in the anisotropic conductive material 23 is not specifically limited, and can be selected, as appropriate.

As the light reflective material, it is possible to use a material having higher optical reflectivity than that of at least the conductive particles 21. Examples of such material include oxides of at least one selected from the group consisting of Ti, Zr, Nb, Al, and Si, or at least one of AlN and MgF, and more specifically at least one selected from the group consisting of $TiO_2$, $ZrO_2$, $Nb_2O_5$, $Al_2O_3$, MgF, MN, and $SiO_2$. It is preferable that the light reflective material in the form of particles is made of an oxide of one element selected from the group consisting of Ti, Zr, Nb, and Al, since a difference in refractive index with respect to the first resin is increased. Further, when the anisotropic conductive material 23 contains the light reflective material, the hardness of the anisotropic conductive material 23 after curing is increased. Thereby, the semiconductor layer 5 can be firmly supported, which can effectively prevent the cracking of the semiconductor layer 5 during the laser liftoff described below. Also during use, the reliability of the light emitting device can be improved.

The anisotropic conductive material 23 may contain, in addition to the conductive particles 21, an auxiliary bonding material for aiding the electrical connection. Examples of such material include fine particles of Au—Sn, Sn—Cu, Sn—Ag—Cu, or Sn—Pd based solder material, or Sn etc. The fine particles are melted during bonding (heating) of the anisotropic conductive material 23, and disposed between the electrode and the wiring. The use of the auxiliary bonding material can improve the bonding strength between the light emitting element and the support member, and enhancing the heat dissipation.

Other components that can be contained in the anisotropic conductive material 23 include additives such as a curing accelerator, a viscosity modifier, or filler for adjusting the hardness after curing.

The supply amount and the viscosity of the anisotropic conductive material 23 are not specifically limited as long as it can fill the space between the chip 9 and the support member 20. For example, it can be used at an amount allowing the conductive material 23 to extend over the outer edge of the chip 9 in the planar view. The amount and viscosity of the conductive material 23 are preferably adjusted to those allowing the conductive material 23 to cover the side surfaces of the substrate 1 of the chip but not cover the upper surface of the substrate 1, so that the removal of the substrate 1 described below can be conducted with good reliability.

The anisotropic conductive material 23 preferably has a shore hardness of D80 or more after curing (after mounting of the chip 9). Such a relatively hard material can firmly support the chip 9, which can effectively prevent the cracking of the semiconductor layer 5 during the laser liftoff described below. Also during the use, the reliability of the light emitting device can be improved.

Figure 15C:
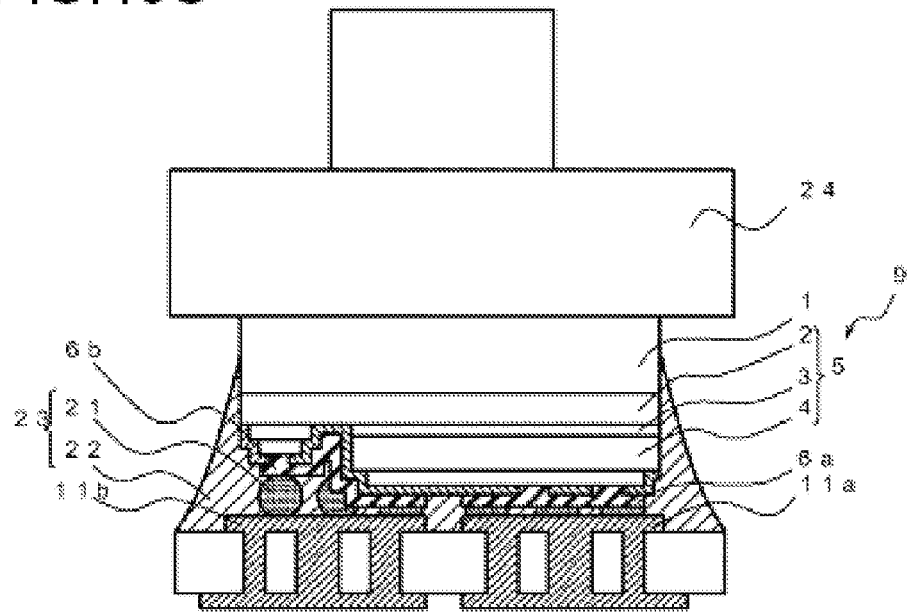

The chip 9 shown in FIG. 14F is reversed from top to bottom placed on the anisotropic conductive material 23, which is supplied onto the support member 20 as mentioned in the above, while being respectively aligned with respect to the support member 20, and then it is pressed and heated by the heat tool as shown in FIG. 15C. Thereby, as shown in FIG. 13, the anisotropic conductive material 23 fills the space between the chip 9 (more specifically, the above structure, the same shall apply hereinafter) and the support member 20, and also mechanically (or physically) bonds the chip 9 to the support member 20.

Further, at this time, the conductive particles 21 in the anisotropic conductive material 23 are bonded while being pressed between the electrodes 6a, 6b and the wirings 11a, 11b to thereby electrically connect them, respectively. That is, the pressing and heating make the binder resin 22 pushed to spread, and one or more conductive particles 21 are disposed between the electrodes and the wirings, respectively, so that electrical anisotropy is expressed with the conductivity in the thickness direction and the insulation in the in-plane direction in the pressed part. As a result, the p-side electrode 6a and the n-side electrode 6b of the chip 9 (more specifically, the structure 7) are electrically connected to the p-side wiring 11a and the n-side wiring 11b of the support member 20, respectively, by the anisotropic conductive material 23 (containing the conductive particles 21 and the first resin 22).

The thickness of the anisotropic conductive material 23 after bonding is preferably, for example, in a range of about 1 to 5 μm between the p-side electrode 6a and the p-side wiring 11a. Thereby, the semiconductor layer 5 can be firmly maintained, so that the removal of the substrate 1 can be conducted easily, and the heat dissipation from the semiconductor layer 5 to the support member 20 is improved.

At this time, the anisotropic conductive material 23 or the binder resin 22 may be cured at least partly in contact with the side surfaces 1a of the substrate 1 of the chip 9. Thus, the chip 9 is bonded and supported at the side surfaces of the chip 9 (more specifically, to the side surfaces of the substrate 1) by the anisotropic conductive material 23, so that the removal of the substrate 1 from the chip 9 can be conducted easily.

The curing method of the anisotropic conductive material 23 can be conducted by using the heat tool 24 for simultaneously heating and pressing the chip 9 from the substrate 1's side as in the fourth embodiment, but is not limited thereto. The heating and pressing may be conducted by using different apparatuses. For example, the chip 9 may be pressed from the substrate 1's side, and heated from the support member 20's side by a hot plate or the like.

Figure 16A:
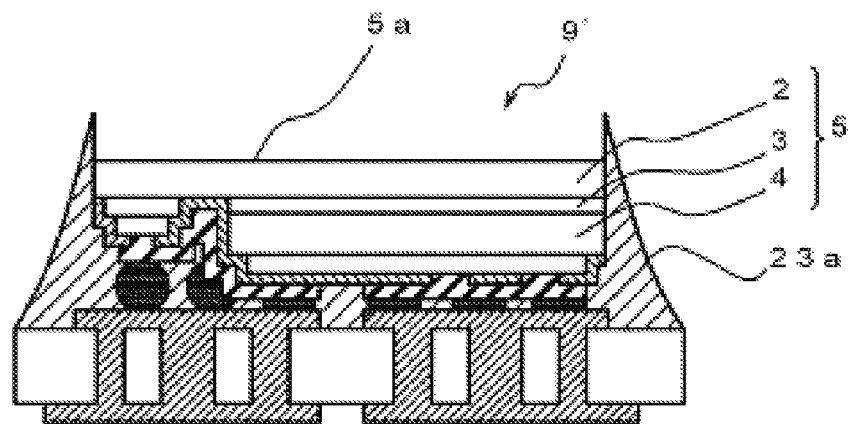
FIG. 16 shows schematic process steps for explaining the method for manufacturing a light emitting device according to the fourth embodiment, FIG. 16A showing the device with the substrate removed from the chip, and FIG. 16B showing a device with the upper surface of the semiconductor layer subjected to roughening.

After that, as shown in FIG. 16A, the substrate 1 is removed from the chip 9. The removal of the substrate 1 can be conducted by laser irradiation. For this purpose, a laser liftoff (LLO) technique can be applied, which may involve irradiating the semiconductor layer 5 from the exposed (back) side of the substrate 1 with a high power laser light such as an excimer laser to subject semiconductor substance to laser ablation in the vicinity of the boundary between the substrate 1 and the semiconductor layer 5, thereby separating the substrate 1 from the semiconductor layer 5, and stripping away the substrate 1. The laser light can be one having such a wavelength capable of passing through the substrate 1 and being absorbed in the semiconductor layer 5. For example, when the substrate 1 is made of sapphire and the semiconductor layer 5 is made of GaN, the above-mentioned excimer laser (wavelength of 248 nm), a YAG laser (wavelength of 266 nm), and the like can be used.

A remainder after removing the substrate 1 from the chip 9 (and more specifically, from the structure 7) forms a light emitting element 9'. The removal of the substrate 1 exposes the upper surface 5a of the semiconductor layer 5, and the wall part 23a of the anisotropic conductive material 23 protrudes as compared to the semiconductor layer 5 exposed by the removal of the substrate 1 at the periphery of the semiconductor layer 5.

The formation of the wall part 23a surrounding the light emitting element 9' can reflect the light emitted from the light emitting element 9' in the lateral direction, so that directionality of the light can be increased. Alternatively, The wall part 23a may not be formed or may be removed after forming the anisotropic conductive material 23. Such removal can be conducted by any appropriate method, such as physical removal, etching, or the like before the removal of the substrate 1, or cutting machining, grinding or the like after the removal of the substrate 1 can be used. Thus, the top part of the anisotropic conductive material 23 can be positioned substantially at the same level as the upper surface 5a of the semiconductor layer 5. By not forming the wall part 23a or removing the wall part 23a, the light absorption of in the wall part 23a can be suppressed.

The anisotropic conductive material 23 and the wall part 23a, as shown in FIG. 22, can be formed into various shapes. For example, as shown in FIG. 22A, the anisotropic conductive material may cover the whole of the upper surface of the support member 20. This can prevent the light absorption in the support member 20. As shown in FIG. 22B, the anisotropic conductive material does not protrude beyond the upper surface of the light emitting element 9' and may have the shape without the wall part 23a. As shown in FIG. 22C, the anisotropic conductive material may surround the light emitting element 9' in the almost uniform width.

Figure 16B:
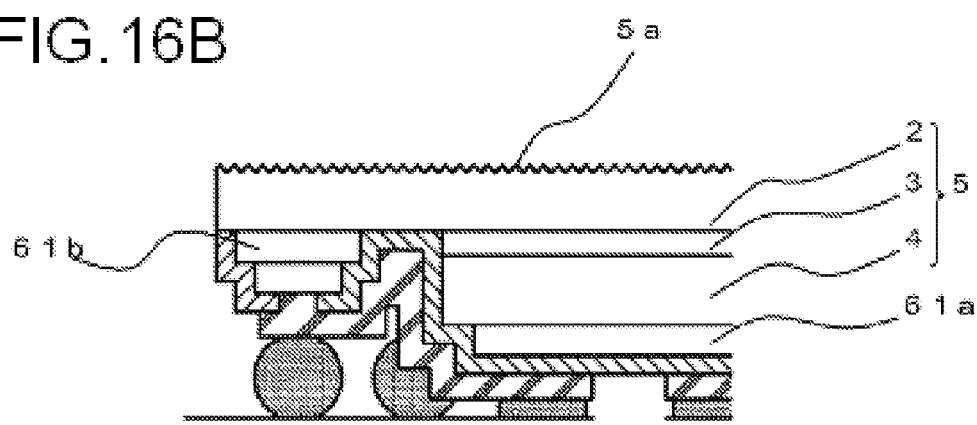

After the removal of the substrate 1, as shown in FIG. 16B, the upper surface 5a of the semiconductor layer 5 is preferably subjected to roughening. The roughening may be conducted by a physical or chemical method. In order to reduce the damage on the light emitting element 9', the chemical etching is preferable. For example, the light emitting element 9' is immersed together with the support member 20 in an acidic solution such as phosphoric acid, or an alkali solution such as KOH, NaOH, TMA, or TMAH (tetramethylammonium hydroxide) solution to thereby etch the upper surface 5a of the semiconductor layer 5. Such treatment can make the upper surface 5a of the semiconductor layer 5 into a rough surface, so that the light extraction efficiency can be further increased.

When the substrate 1 has a convexoconcave surface on which the semiconductor layer 5 is to be formed, the upper surface 5a of the semiconductor layer 5 will be convexoconcave in shape corresponding to the convexoconcave surface of the substrate 1. When this semiconductor layer 5 is subjected to the above described roughening treatment, the light extraction efficiency can be further increased.

Figure 17A:
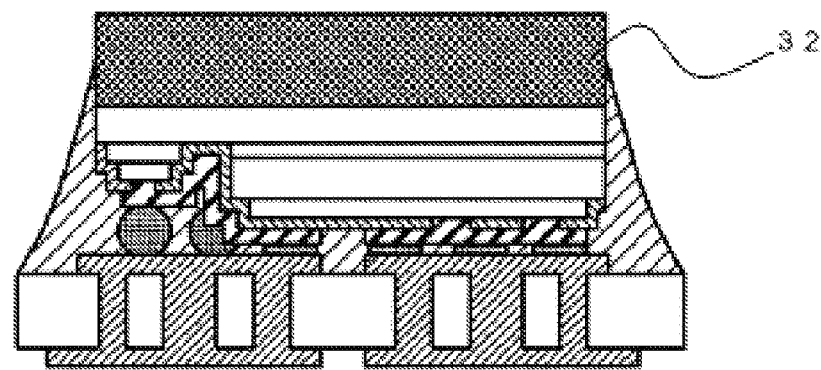
FIG. 17 shows schematic process steps for explaining the method for manufacturing a light emitting device according to the fourth embodiment, FIG. 17A showing a phosphor layer formed on the upper surface of the semiconductor layer, and FIG. 17B showing a sealing member supplied on the semiconductor layer provided with the phosphor layer formed thereon, and on the anisotropic conductive material.

Thereafter, as shown in FIG. 17A, a phosphor layer 32 is formed on the upper surface 5a of the semiconductor layer 5. The formation of the phosphor layer 32 can be conducted by, for example, bonding a phosphor sheet (or phosphor plate, the same shall apply hereinafter) on the upper surface 5a of the semiconductor layer 5. The bonding may use an adhesive such as a translucent silicone-based resin. The phosphor sheet may be previously cut corresponding to the size of the upper surface 5a of the semiconductor layer 5 or the size of the light emitting device to be completed. However, when a plurality of the support member form a collective substrate, the phosphor sheet may be formed to cover a plurality of the light emitting elements on the plurality of the support member at one time. Thereby, mass productivity is increased. When the support member is previously divided into pieces, the phosphor sheet is preferably of the same size or slightly larger size than the upper surface 5a of the semiconductor layer 5 (not to expose the upper surface 5a).

The phosphor layer 32 may be formed of phosphor only, but may be formed by mixing phosphor with a base material. The base material is preferably a translucent member. Examples of the material for the translucent member include resins, glass, inorganic materials, and the like. Specifically, it may be a glass plate provided with phosphor, or a phosphor crystal, or a single crystal, polycrystal, amorphous, or ceramic which include a phosphor crystal phase. Additionally, it may be a sintered body, aggregate, or porous body of phosphor crystal particles and an added translucent member, as appropriate; the above sintered body, aggregate or porous body to which the translucent member such as a translucent resin is mixed or impregnated; a the translucent member, for example, a molded article of translucent resin, containing phosphorus particles; or the like. As typical phosphors capable of obtaining white light in combination with a blue light emitting element, YAG (yttrium-aluminum-garnet)-based phosphors and LAG (lutethium-aluminium-garnet)-based phosphors having a garnet structure and activated with cerium are preferable. In addition, phosphors such as BAM, BAM:Mn, (Zn, Cd) Zn:Cu, CCA, SCA, nitride phosphors emitting red light (SCESN, SESN, CESN, CASBN, and $CaAlSiN_3$:Eu) can be used. The translucent member may be formed of an inorganic material such as glass, from the viewpoint of the heat resistance or light resistance. The light emitting element 9' of the fourth embodiment does not include the substrate 1, and thus can emit a very strong light from the upper surface 5a of the semiconductor layer 5. Thus, the phosphor layer 32 formed on the upper surface 5a of the semiconductor layer 5 is preferably made of a material having high light resistance.

When the anisotropic conductive material 23 has the wall part 23a (that is, it has the protrusion surrounding the periphery of the light emitting element 9'), it may be difficult to cover the upper surface of the light emitting element 9' by the phosphor layer 32 which is hard or stiff. In this case, for example, a soft sheet made of a silicone-based resin containing phosphor can be used as the phosphor layer 32, so that the light emitting element 9' can be covered easily. Particularly, the use of the phosphor sheet including a resin showing flexibility in a semi-cured state allows the phosphor layer 32 to be deformed along the shape of the anisotropic conductive material 23 or the wall part 23a, so that the semiconductor layer 5, the anisotropic conductive material 23, and the like can be covered easily.

In the fourth embodiment, the phosphor layer 32 may be disposed away from the light emitting element 9'.

Alternatively, the phosphor layer 32 can be formed by electrodepositing a phosphor film on the upper surface 5a of the semiconductor layer 5. The thus-formed phosphor layer 32 can be a thinner film than that formed by another manufacturing method, and thus the light emitting device can be obtained with the high light extraction efficiency. The phosphor may be provided by spraying. Thus, the color of the light emitted from the light emitting device can be adjusted, and the productivity of the light emitting device can be increased.

As the forming method of the phosphor layer 32, it is possible to use various methods such as potting, printing, compression molding, transfer molding, and the like, in addition to the above method.

The phosphor layer 32 is formed on the upper surface 5a of the semiconductor layer 5 in a substantially uniform thickness in FIG. 17, but is not limited thereto. The phosphor layer 32 may be formed in a non-uniform thickness, or in a curved or hemispherical shape, or with a plurality of convexoconcave.

Figure 17B:
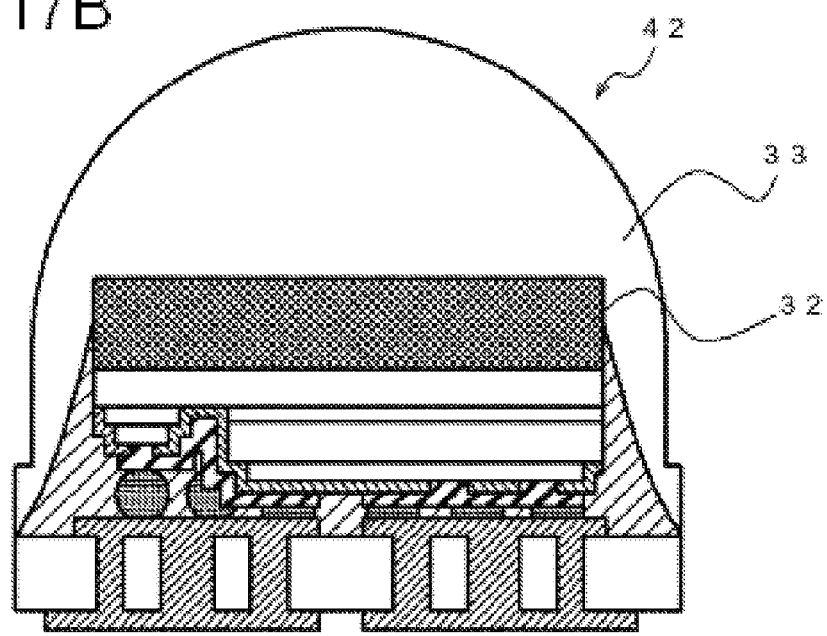

Then, as shown in FIG. 17B, a sealing member 33 is supplied (on the semiconductor layer 5 provided with the phosphor layer 32 formed thereon, and on the anisotropic conductive material 23, etc.) for sealing (molding). As the sealing member, materials including resin curable by heat, light, and/or humidity such as epoxy resin of good translucency, a thermoplastic resin, and inorganic materials such as glass may be used. A silicone-based resin is preferably used from viewpoints of translucency, transparency, heat resistance, adhesion, and the like. Such sealing can be conducted by potting, spin coating, transfer molding, compression molding, or the like.

Although the shape of the sealing member 33 is not specifically limited, the sealing member 33 preferably has a hemispherical shape while setting the light emitting element 9' as the center, so as to improve the light extraction efficiency from the light emitting element 9'. It is preferable to make the upper surface of the sealing member 33 flat, so that the light emitting device 42 can be thinned.

As described in the above, the light emitting device 42 of the fourth embodiment is manufactured. According to this embodiment, it becomes possible to manufacture the light emitting device 42 with high performance and high reliability, effectively (in a manner appropriate for mass production and cost-saving). Particularly, according to the fourth embodiment, since the substrate 1 is removed in the light emitting device 42, the loss of light due to attenuation by reflection of the light within the substrate 1 can be avoided, and thereby high light extraction efficiency can be obtained. Furthermore, the conductive member, the insulating layer and the electrode are formed to overlap with the semiconductor layer 5 by, for example, forming the n-side electrode 6b widely enough to overlap with the p-type semiconductor layer 4, so that the strength of the light emitting element 9' is increased to reduce the cracking in the semiconductor layer 5, and therefore it becomes possible to provide the light emitting device 42 with the increased mass productivity and reliability.

In the fourth embodiment, the light reflective material 31 is used in the anisotropic conductive material 23 to increase the optical reflectivity of the anisotropic conductive material 23. Thereby, it becomes possible to obtain the light emitting device 42 with the high light extraction efficiency.

(Fifth Embodiment)

In the light emitting device of a fifth embodiment, the light emitting element may include a plurality of conductive members and a plurality of insulating layers (for example, two or more layers for each).

Figure 19A:
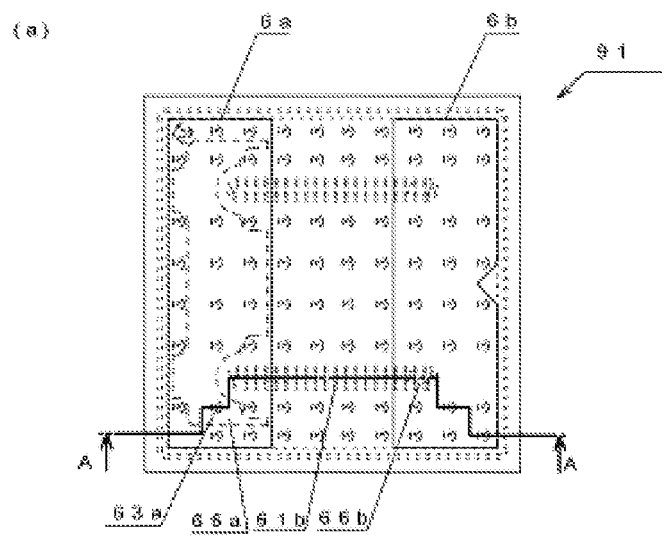
FIG. 19 shows views for explaining a structure according to a fifth embodiment, FIG. 19A showing a schematic plan view of the structure, and FIG. 19B showing a schematic cross-sectional view of the structure taken along the line A-A of FIG. 19A.
Figure 19B:
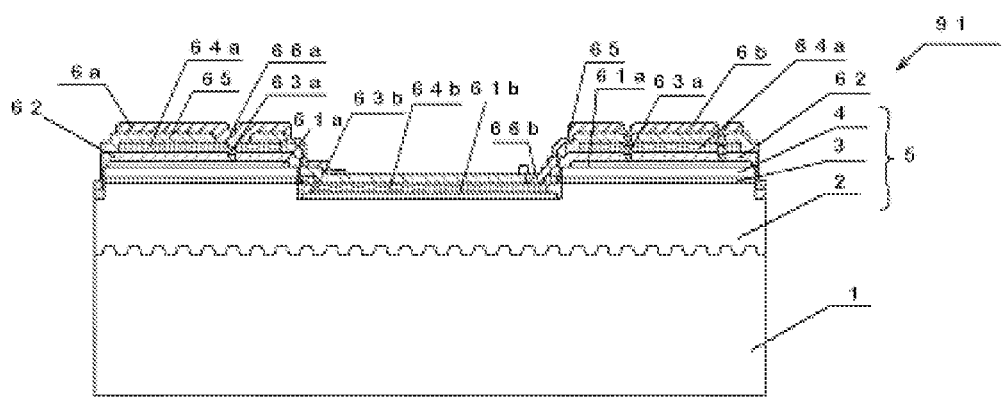

As shown in FIG. 19, the shape of the chip 91 of the fifth embodiment is rectangular as viewed from the electrode surface side. The chip 91 is provided with the p-side electrode 6a and the n-side electrode 6b on the outermost surface (mounting surface) on the electrode surface side. The chip 91 has a structure with more steps wherein both the n-side electrode 6b and the p-side electrode 6a are disposed above the p-type semiconductor layer 4. For the purpose of easier understanding, in FIG. 19A, the n-side electrode 6b and the p-side electrode 6a positioned on the front-most side in the direction vertical to the plane of paper are shown by a solid line, and regions indicated by reference numerals 61b, 63a, 66a, etc. are represented by a broken line.

As shown in FIG. 19, the chip 91 mainly includes a substrate 1, a semiconductor layer 5, a p-side first conductive member 61a, an n-side first conductive member 61b, a first insulating layer 62, a p-side second conductive member 64a, an n-side second conductive member 64b, a second insulating layer 65, a p-side electrode 6a, and an n-side electrode 6b.

More specifically, the semiconductor layer 5 is formed on the substrate 1. The semiconductor layer 5 includes an n-type semiconductor layer (first semiconductor layer) 2, an active layer 3, and a p-type semiconductor layer (second semiconductor layer) 4, in this order. The semiconductor layer 5 is partly removed from the side of the p-side semiconductor layer 4 to have an exposed part exposing the n-type semiconductor layer 2 from the p-type semiconductor layer 4. The p-side first conductive member 61a is formed on the p-type semiconductor layer 4. The n-side first conductive member 61b is formed on the exposed part of the n-type semiconductor layer 2. The first insulating layer 62 is formed on the p-side first conductive member 61a and the n-side first conductive member 61b. The first insulating layer 62 includes a first through hole(s) 63a exposing the p-side first conductive member 61a, and a first through hole(s) 63b exposing the n-side first conductive member 61b. The p-side second conductive member 64a and the n-side second conductive member 64b are formed on the first insulating layer 62. The p-side second conductive member 64a is electrically connected to the p-side first conductive member 61a in the first through hole 63a. The n-side second conductive member 64b is electrically connected to the n-side first conductive member 61b in the first through hole 63b. The second insulating layer 65 is formed on the first insulating layer 62 to cover the p-side second conductive member 64a and the n-side second conductive member 64b. The p-side second conductive member 64a is in contact with the p-side electrode 6a in a second through hole 66a, and the n-side second conductive member 64b is in contact with the n-side electrode 6b in a second through hole 66b.

As shown in FIG. 19, in the fifth embodiment, the exposed part of the n-type semiconductor layer 2 is in the form of a groove extending in the direction along the A-A line shown in FIG. 19A. In this example, two exposed parts distant from each other in the shorter direction of the exposed part (in the direction perpendicular to the A-A line shown in FIG. 19A) are formed in the center part of the chip 91. In forming the above exposed part(s), as shown in FIG. 19, the n-type semiconductor layer 2 is also exposed at the outer periphery of the chip 91. This area is covered with the first insulating layer 62. As to the exposed part(s) of the n-type semiconductor layer 2, one at the center part is covered by the n-side first conductive member 61b, while the other at the peripheral part is covered by the first insulating layer 62. The end surface of the active layer 3 and the p-type semiconductor layer 4 surrounding the exposed part of the n-type semiconductor layer 2 is covered by the first insulating layer 62 and forms the first through hole 63b.

This structure 7 can be manufactured as follows.

The n-type semiconductor layer 2, the active layer 3, and the p-type semiconductor layer 4 are laminated on the substrate 1 in this order to obtain the semiconductor layer 5. A part of this laminate is etched by etching such as RIE (reactive ion etching). At this time, the laminate is etched from the side of the p-type semiconductor layer 4 so as to expose a surface of the n-type semiconductor layer 2. In order to increase the area of the active layer 3, the exposed part of the n-type semiconductor layer 2 is formed in a smaller area than that of the p-type semiconductor layer 4 of the structure 7.

Then, by using known techniques for formation of electrodes, for example, deposition such as sputtering or the like and liftoff using resist etc., the p-side first conductive member 61a is formed on substantially whole of the upper surface of the p-type semiconductor layer 4, and the n-side first conductive member 61b is formed on substantially whole of the exposed part of the n-type semiconductor layer 2 exposed from the p-type semiconductor layer 4.

Then, the first insulating layer 62 is formed as DBR (specifically, DBR is composed of an underlayer and three pairs of a low refractive index layer and a high refractive index layer) on the whole surface of the semiconductor layer 5 at the side provided with the p-side first conductive member 61a and the n-side first conductive member 61b. The first through holes 63a, 63b are formed by RIE to expose parts of the p-side first conductive member 61a and the n-side first conductive member 61b, respectively. A plurality of the first through holes 63a are distributed uniformly with respect to the p-side first conductive member 61a. Thus, current constriction within the light emitting element 91' can be reduced, so that the light emitting device can be obtained with high light emitting efficiency.

Subsequently, an electrode material such as Rh or the like is deposited on the first insulating layer 62. Thus, as shown in FIG. 19, the p-side second conductive material 64a and the n-side second conductive member 64b are formed on the first insulating layer 62. The p-side second conductive member 64a fills the first through hole 63a of the first insulating layer 62 to be electrically connected to the p-side first conductive member 61a. The n-side second conductive member 64b fills the first through hole 63b to be electrically connected to the n-side first conductive member 61b.

Next, a second insulating layer 65 made of $SiO_2$ or the like is formed on the whole surface of the p-side second conductive member 64a and the n-side second conductive member 64b. Then, the second insulating layer 65 is etched to form second through holes 66a, 66b.

Subsequently, an electrode material such as Ti, Pt, Au, etc. is deposited on the second insulating layer 65 by sputtering, and shaped by liftoff and the like to thereby form the p-side electrode 6a and the n-side electrode 6b as shown in FIG. 19. The p-side electrode 6a fills the second through hole 66a to be electrically connected to the p-side second conductive member 64a. The n-side electrode 6b fills the second through hole 66b to be electrically connected to the n-side second conductive member 64b. And, the n-side electrode 6b is formed to overlap with the p-side semiconductor layer 4 while the first insulating layer 62 and the second semiconductor layer 65 are disposed therebetween. Also, the p-side electrode 6a is formed to overlap with the exposed part of the n-side semiconductor layer 4 while the first insulating layer 62 and the second insulating layer 65 are disposed therebetween. As shown in FIG. 19, the p-side electrode 6a and the n-side electrode 6b have steps corresponding to the exposed parts and through holes of the semiconductor layer positioned under the electrodes. Even the electrodes have such steps, the mounting can be conducted sufficiently by using the anisotropic conductive material.

Subsequently, the substrate 1 is cut on a dicing line into pieces of the chips 91.

As described in the above, there is manufactured the chip 91 provided with the substrate 1, the semiconductor layer 5 formed on the substrate 1, and the p-side electrode 6a and the n-side electrode 6b formed on the same side of the semiconductor layer 5 opposite to the substrate 1.

On the other hand, a support member 20 including a p-side wiring 11*a* and an n-side wiring 11*b* on the same surface is prepared in a similar manner as described in the above with reference to FIG. 15A for the fourth embodiment.

Then, an anisotropic conductive material 23 is supplied onto the support member 20. The anisotropic conductive material 23 may be the same as that of the fourth embodiment.

Figure 20:
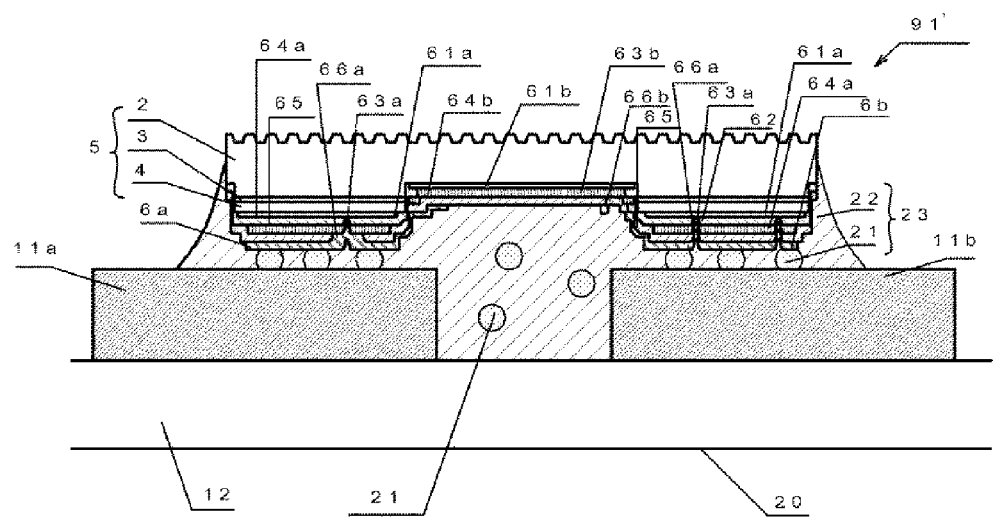
FIG. 20 shows a schematic cross-sectional view of a light emitting device according to the fourth embodiment.
Figure 21:
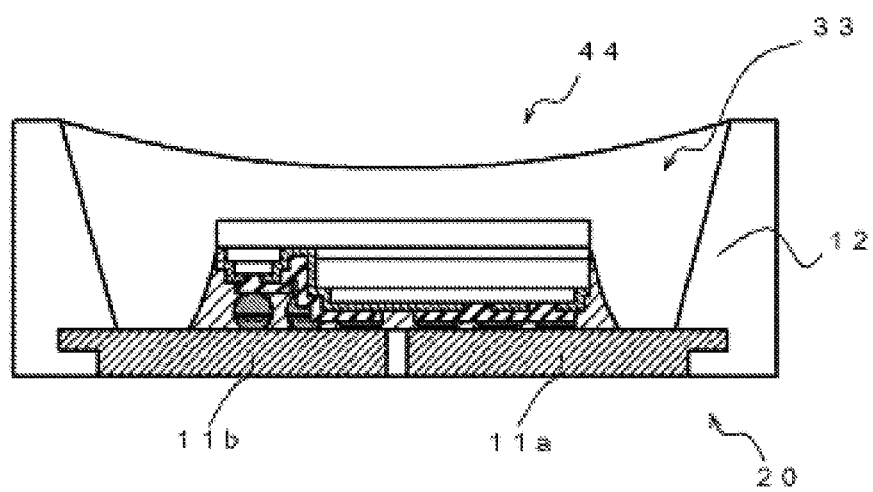
FIG. 21 shows a schematic cross-sectional view for explaining of the light emitting device according to the fourth embodiment.

As shown in FIG. 20, the chip 91 shown in FIG. 19 is reversed from top to bottom and placed on the anisotropic conductive material 23, which is supplied onto the support member 20 as mentioned in the above, while the p-side electrode 6*a* and the n-side electrode 6*a* are opposed to the wirings of the support member 20, and then it is pressed and heated to cure the anisotropic conductive material 23. Then, the substrate 1 is removed from the chip 91 similarly to the fourth embodiment. A remainder by removing the substrate 1 from the chip 91 forms a light emitting element 91'.

Thereby, the anisotropic conductive material 23 mechanically (or physically) bonds the chip 9 to the support member 20 by curing the binder resin 22 while the anisotropic conductive material 23 fills the space between the chip 91 (more specifically, the above structure, the same shall apply hereinafter) and the support member 20. Further, at this time, the conductive particles 21 in the anisotropic conductive material 23 are bonded while being pressed between the p-side electrode 6*a* and the p-side wiring 11*a* and between the n-side electrode 6*b* and the n-side wiring 11*b* to thereby electrically connecting them. As a result, the p-side electrode 6*a* and the n-side electrode 6*b* of the chip 91 (more specifically, the structure 7) are electrically connected to the p-side wiring 11*a* and the n-side wiring 11*b* of the support member 20, respectively, by the anisotropic conductive material 23 (containing the conductive particles 21 and the first resin 22).

As described in the above, the light emitting device of the fifth embodiment is manufactured. Particularly, according to the fifth embodiment, since the substrate 1 is removed in the light emitting device, the loss of light due to attenuation by reflection of the light within the substrate 1 can be avoided, and thereby the high light extraction efficiency can be obtained. Furthermore, a plurality of the conductive members and a plurality of the insulating members are formed to overlap with the semiconductor layer 5, so that the strength of the light emitting element 91' is increased to reduce the cracking in the semiconductor layer 5, and therefore it becomes possible to provide the light emitting device with the increased mass productivity and reliability. Furthermore, according to the fifth embodiment, the electrical connection between the electrodes 6*a*, 6*b* and the wirings 11*a*, 11*b* is ensured by the conductive particles 21 bonded therebetween under pressure, and the n-side electrode 6*b* is formed widely enough to overlap with the p-type semiconductor layer 4, so that the mounting and the electrical connection of the light emitting element 91' (chip 91) can be conducted easily.

In other respects, the fifth embodiment can also obtain the similar effects as those of the fourth embodiment.

The five preferred embodiments have been described above, but the present invention is not limited to those disclosed embodiments and can be made with various modifications.

The light emitting device according to the aspect of the fourth and the fifth embodiment is not particularly limited as long as the structure 7 includes the metal member overlapping with the first semiconductor layer 2 and the second semiconductor layer 4, and the p-side electrode 6*a* and the n-side electrode 6*b* thereof are electrically connected to the p-side wiring 11*a* and the n-side wiring 11*b* of the support member 20, respectively, using the anisotropic conductive material 23.

For example, the conductive particles 21 contained in the anisotropic conductive material 23 may be formed of a conductive material only.

Figure 23:
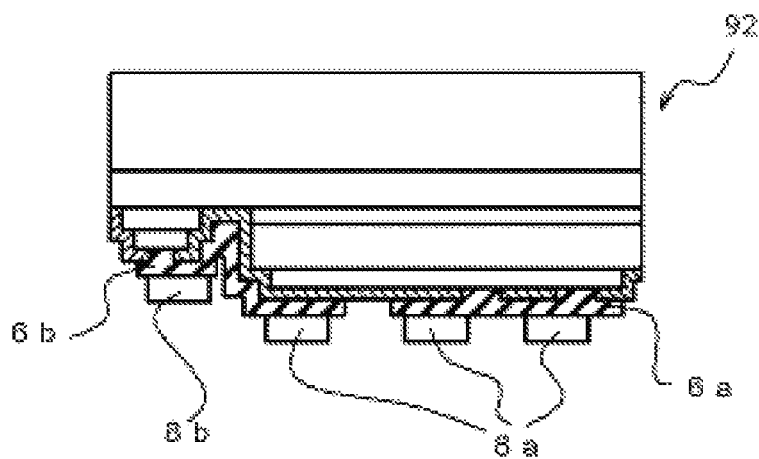
FIG. 23 shows a schematic cross-sectional view for explaining an example of a structure usable in the fifth embodiment, and more specifically, shows bumps formed on the p-side electrode and the n-side electrode.

For example, as shown in FIG. 23, the followings are possible: the bumps 8*a*, 8*b* can be formed on the p-side electrode 6*a* and the n-side electrode 6*b* or the p-side wiring 11*a* and the n-side wiring 11*b* of the support member 20; the conductive particles 21 in the anisotropic conductive material 23 can be bonded while being pressed between the bumps 8*a*, 8*b* and the wirings 11*a*, 11*b* or the electrodes 6*a*, 6*b* to thereby electrically connecting them; and as a result, the p-side electrode 6*a* and the n-side electrode 6*b* of the chip 92 can be electrically connected to the p-side wiring 11*a* and the n-side wiring 11*b* of the support member 20, respectively, via the bumps 8*a*, 8*b* and the anisotropic conductive material 23 containing the conductive particles 21 and the first resin 22. Thereby, a distance between the electrodes 6*a*, 6*b* of the light emitting element and the support member 20 can be made larger, the conductive particles 21 can be prevented from contacting with other part than the part between the electrodes 6*a*, 6*b* of the chip 92 and the wirings 11*a*, 11*b*, so that the adhesion and electrical contact by the anisotropic conductive material 23 can be achieved easily. As the material of the bumps 8*a*, 8*b*, it is possible to use, for example, Au, Cu, Al and so on. It is preferable to form a plurality of the bumps 8*a* and a plurality of the bumps 8*b* on the p-side electrode 6*a* and the n-side electrode 6*b*, respectively. Thereby, the connection is made stably.

For example, after removing the substrate 1 from the structure 7, a translucent protective film of $SiO_2$, $AlO_3$, or the like may be formed to cover the exposed upper surface 5*a* of the semiconductor layer 5. Such a protective film reinforces the semiconductor layer 5, so that the light emitting device can be obtained with high reliability. The protective film can be formed by sputtering, ALD, or the like. Particularly, in case of ALD, the formed protective film can be dense and strong, the light emitting device can be obtained with high reliability. Such protective film may cover the side surfaces of the semiconductor layer 5 in addition to the upper surface 5*a* of the semiconductor layer 5, and may be formed to cover other members than the light emitting element, for example, the anisotropic conductive material 23, the p-side wiring 11*a* and the n-side wiring 11*b*, the support member 20, and so on.

The light emitting device of the embodiments may not include the phosphor layer 32 and/or the sealing member 33.

The descriptions in the above for each embodiment can also be applied to other embodiments in the similar manner unless otherwise specified.

EXAMPLES

Example 1

Example 1 shows a case in which a light emitting device is manufactured according to the second embodiment.

A sapphire substrate is used as the substrate 1, and in an MOCVD reaction device, semiconductor layers are grown thereon in sequence as follows:

First, an AlGaN buffer layer and a non-doped GaN layer (both not shown) are deposited on the sapphire substrate 1 having surface convexoconcave.

Then, a Si doped GaN layer is deposited thereon as an n-type contact layer, and five layers in total of non-doped GaN layers and an Si doped GaN layers are alternately deposited as an n-type clad layer. Further, a superlattice structure of undoped GaN and undoped InGaN layers is formed thereon. As a result, the n-type semiconductor layer 2 composed of these layers is formed.

A Si doped GaN barrier layer and a non-doped GaN barrier layer are deposited on the n-type semiconductor layer 2 in this order. Then, an InGaN well layer and an InGaN barrier layer are deposited alternately and repeatedly nine times for each layer to form a multi-quantum-well structure. As a result, the active layer 3 composed of these layers is formed.

A Mg doped AlGaN layer as a p-type clad layer and a Mg doped GaN layer as a p-type contact layer are deposited on the active layer 3 in this order. As a result, the p-type semiconductor layer 4 composed of these layers is formed.

Thus laminated semiconductor layers on the substrate 1 as described above is annealed to produce a wafer (see FIG. 7A).

The resultant wafer is etched at a predetermined region to expose an n-type contact layer, and thereby the semiconductor layer 5 is obtained (see FIG. 7B).

Thereafter, a reflective electrode containing Ag is formed as the p-side electrode 6a on the p-type contact layer as the top layer (on the light emitting region). Then, another reflective electrode containing Al is formed as the n-side electrode 6b on the exposed n-type contact layer (see FIG. 7C). The reflective electrode containing Ag and the reflective electrode containing Al each are formed with a thickness of 1.0 μm by sputtering. Further, a $SiO_2$ film is formed and patterned as a protective film with a thickness of 0.4 μm on the p-side electrode 6a and the n-side electrode 6b. At this time, openings are formed in positions corresponding to the bumps 8a, 8b.

Then, the Au bumps 8a, 8b are formed on the p-side electrode 6a and the n-side electrode 6b within the openings of the $SiO_2$ film (see FIG. 7D). The bump 8a has a height of 15 μm from the p-side electrode 6a. The bump 8b is formed such that its top is substantially at the same height as the top of the bump 8a. Thereafter, the substrate 1 is ground at its backside, and cut by laser in the size of 1.0 mm×1.0 mm to produce the chip (dice) 10 of the light emitting element.

On the other hand, a surface of the core 21a made of acrylic resin (second resin) is covered with an Au layer as the conductive layer 21b to produce the conductive particles 21. The thickness of the Au layer is about 0.3 μm, the particle size distribution of the conductive particles 21 is from 3 to 5 μm, and the number average particle size thereof is 4 μm. The conductive particles 21, epoxy resin as the binder resin 22 (first resin), and AlN particles as the filler are blended to prepare the anisotropic conductive material 23 (see FIG. 6). The particle size distribution of the AlN particles is from 0.2 to 1.0 μm, and the number average particle size thereof is 0.5 μm. In the anisotropic conductive material 23, $|k_2-k_1|/k_1$=about 0.19. The compounding ratios of the epoxy resin (first resin), the filler, and the conductive particles are adjusted so as to satisfy $|k_2-k_a|/k_a$=about 0.05 in the anisotropic conductive material 23.

Then, the support member 20 including the p-side wiring 11a and the n-side wiring 11b on the same surface is prepared (see FIG. 8A). The anisotropic conductive material 23 prepared above is supplied thereto to cover the wirings 11a, 11b. The chip 10 obtained above is reversed from top to bottom, and placed thereon while being aligned with respect to the support member 20, and then it is pressed and heated. Thus, the binder resin 22 is thermally cured while the conductive particles 21 are bonded between the bumps 8a, 8b and the wirings 11a, 11b under pressure to ensure the electrical connection therebetween, and therefore the chip 10 is flip-chip mounted on the support member 20 (see FIG. 8B).

Then, a high reflective material containing a silicone-based resin and $TiO_2$ particles dispersed therein is supplied onto the anisotropic conductive material 23 so as to surround the periphery of the chip 10, and heated to thereby form the light reflector 31 (see FIG. 9A). Thereafter, the substrate 1 (sapphire substrate) is irradiated with excimer laser from the exposed surface (bottom) side to separate the substrate 1 at the boundary with the AlGaN buffer layer. At this time, the substrate 1 is held by the wall part 23a of the anisotropic conductive material 23 in intimate contact with the side surfaces 1a, and remained on the buffer layer without being blown off. The remaining substrate 1 is mechanically picked up and removed (see FIG. 9B).

Then, the wall part 23a of the anisotropic conductive material 23 is taken away such that the top of the anisotropic conductive material 23 (and the light reflector 31) is substantially at the same height as the upper surface 5a of the semiconductor layer 5 (exposed surface of the AlGaN buffer layer) (see FIG. 10A). Thereafter, the phosphor sheet having a size of 1.1 mm×1.1 mm is bonded to the upper surface 5a of the semiconductor layer 5 (exposed surface of the AlGaN buffer layer) by a silicone-based resin to form the phosphor layer 32 (see FIG. 10B). As the phosphor sheet, a sheet contains YAG is used.

Finally, a silicone-based resin is supplied as the sealing resin 33 on the phosphor layer 32, the anisotropic conductive material 23, and the light reflector 31, and heated for molding. In this way, the light emitting device 40 is manufactured (see FIG. 11).

The light emitting device 40 obtained in example 1 is supposed to emit white light, and show luminous flux of 120 lm, forward voltage of 3.0 V, luminance of 28 cd/mm$^2$, and color temperature of 5,000 K at driving current of 350 mA. In a temperature cycle test for confirming the reliability, the light emitting device 40 is exposed to show no failure after 1,000 temperature cycles in the range from −30° C. to 100° C.

Example 2

Example 2 shows a case in which a light emitting device is manufactured according to the third embodiment.

The light emitting device 41 is manufactured in a similar manner to Example 1, expect for followings: the chip 10 is flip-chip mounted on the support member 20 while the anisotropic conductive material 23 is in contact with the side surfaces 1a of the substrate 1 around the complete periphery of the substrate 1; after removing the substrate 1, the wall part 23a of the anisotropic conductive material 23 remains without being taken away; and a material containing a silicone-based resin and phosphor particles dispersed therein is supplied into a recessed portion (cup) surrounded by the wall part 23a of the anisotropic conductive material 23 on the semiconductor layer 5 (potting), and cured by heating.

The light emitting device 41 obtained in example 2 is supposed to emit white light, and show luminous flux of 115 lm, forward voltage of 3.0 V, luminance of 30 cd/mm$^2$, and color temperature of 5,000 K at driving current of 350 mA. In a temperature cycle test for confirming the reliability, the light emitting device 41 is exposed to show no failure after 1,000 temperature cycles in the range from −30° C. to 100° C.

Comparative Example 1

A light emitting device is manufactured in a similar manner to Example 1, expect for the following: the chip 10 is flip-chip mounted on the support member 20 by ultrasonic bonding between the bumps 8a, 8b and the wirings 11a, 11b; and a silicone-based resin is injected as a underfill resin into the space formed between the chip 10 and the support member 20, and cured by heating.

The light emitting device obtained in this comparative example is supposed to emit white light, and show luminous flux of 120 lm, forward voltage of 3.0 V, luminance of 28 cd/mm$^2$, and color temperature of 5,000 K at driving current of 350 mA. In a temperature cycle test for confirming the reliability, the light emitting device is exposed to show failure after 350 temperature cycles in the range from −30° C. to 100° C.

Example 3

Example 3 shows a case in which a light emitting device is manufactured by using a light emitting element similar to the fourth embodiment.

As shown in FIG. 14, a wafer of a sapphire substrate is used as the substrate 1, and in an MOCVD reaction device, semiconductor layers are grown thereon in sequence as follows.

First, an AlGaN buffer layer and a non-doped GaN layer are deposited on the sapphire substrate 1 having surface convexoconcave.

Then, a Si doped GaN layer is deposited thereon as an n-type contact layer, and five layers in total of non-doped GaN layers and an Si doped GaN layers are alternately deposited as an n-type clad layer. Further, a superlattice structure of undoped GaN and undoped InGaN layers is formed thereon. Thus, the n-type semiconductor layer 2 composed of these layers is formed. A Si doped GaN barrier layer and a non-doped GaN barrier layer are deposited on the n-type semiconductor layer 2 in this order. Then, an InGaN well layer and an InGaN barrier layer are deposited alternately and repeatedly nine times for each layer to form a multi-quantum-well structure. As a result, the active layer 3 composed of these layers is formed. An Mg doped AlGaN layer as a p-type clad layer and an Mg doped GaN layer as a p-type contact layer are deposited on the active layer 3 in this order. As a result, the p-type semiconductor layer 4 composed of these layers is formed. Thus laminated semiconductor layers on the wafer as the substrate 1 is produced as described above.

Then, the n-type contact layer is exposed by etching to thereby produce the semiconductor layer 5.

Thereafter, the p-side conductive member 61a and the n-side conductive member 61b are formed on the p-type contact layer as the top layer (on the light emitting region) and the exposed n-type contact layer, respectively, by sputtering so as to deposit ITO (120 nm)/Rh (100 nm)/Au (550 nm)/Rh (100 nm) in this order from the semiconductor layer 5's side. Further, a DBR structure composed of a laminate of SiO$_2$ and Nb$_2$O$_5$ is formed as the insulating layer 62 with a thickness of about 1 μm to cover the semiconductor layer 5, the p-side conductive member 61a, and the n-side conductive member 61b. Thereafter, the through hole(s) 63a for exposing the p-side conductive member 61a, and the through hole(s) 63b for exposing the n-side conductive member 61b are formed in the insulating layer 62 by RIE.

The p-side electrode 6a and the n-side electrode 6b are formed by sputtering so as to deposit AlSiCu alloy (500 nm)/Ti (200 nm)/Pt (500 nm)/Au (500 nm) in this order from the semiconductor layer 5's side, on the insulating layer 62 as well as respectively on the p-side conductive member 61a and the n-side conductive member 61b exposed in the through holes 63a, 63b. The through holes 63a, 63b are filled with the p-side electrode 6a and the n-side electrode 6b, respectively. Then, a protective film is formed of SiO$_2$ (300 nm) with the through holes for conduction, on the p-side electrode 6a and the n-side electrode 6b. A difference in height between the p-side electrode 6a and the n-side electrode 6b is about 2 μm at a part bringing the maximum value (indicated by d1 in the drawings) Then, the substrate 1 is ground at its backside, and diced (dicing) into pieces with the size of 1.0 mm×1.0 mm to produce the chip 9 of the light emitting device. The p-side electrode 6a and the n-side electrode 6b are formed to have substantially same rectangular shape of 300 μm×800 nm in the planar view, and are disposed symmetrically with respect to the center line of each chip 9 singulated. Further, the n-side electrode 6b has a part overlapping with the p-side semiconductor layer 4 (see FIG. 14).

On the other hand, the conductive particles 21 wherein a surface of the core 21a made of acrylic resin (second resin) is coated with an Au layer as the conductive layer 21b are prepared. The thickness of the Au layer is about 0.3 μm, the particle size distribution of the conductive particles 21 is from 3 to 5 μm, and the number average particle size thereof is 4 μm. The conductive particles 21, epoxy resin as the binder resin 22 (first resin), TiO$_2$ particles as the light reflective member, an Sn—Cu based solder particles as the auxiliary bonding material are blended to prepare the anisotropic conductive material 23 having an optical reflectivity of about 70% and a shore hardness of about 80 after curing (see FIG. 6).

Figure 24A:
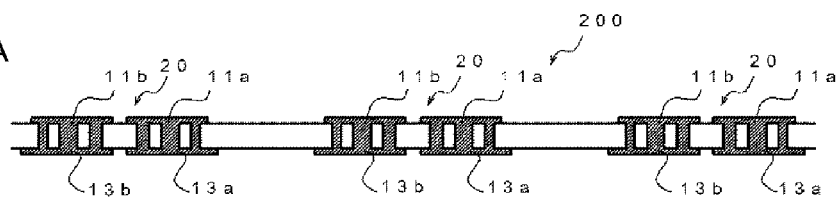
FIG. 24 shows schematic process steps for explaining a method for manufacturing a light emitting device according to example 3, FIG. 24A showing a collective substrate prepared by using aluminum nitride as the base to have pieces of the support members arranged and coupled together, and each provided with the p-side wiring and the n-side wiring on the same surface, FIG. 24B showing chips reversed from top to bottom and placed thereon while being aligned with respect to the support member, and FIG. 24C showing binder resin of an anisotropic conductive material being thermally cured while conductive particles of the anisotropic conductive material are bonded between the p-side and n-side electrodes and the p-side and n-side wirings under pressure.
Figure 24B:
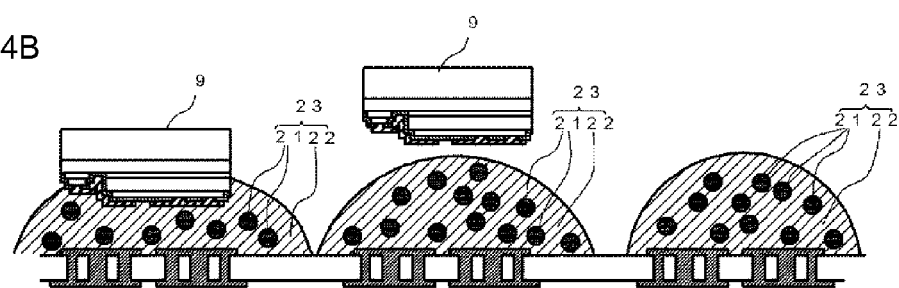
Figure 24C:
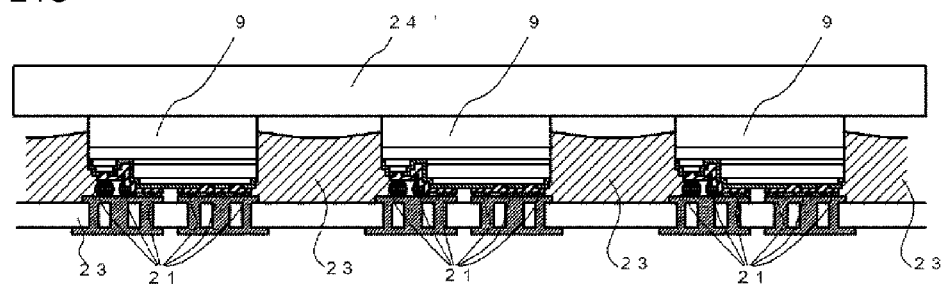

Then, a collective substrate 200 is prepared by using aluminum nitride as the base 12 to have 20×30 pieces of the support members 20 arranged and coupled together, and each having a size of 1.4 mm×1.4 mm and provided with the p-side wiring 11a and the n-side wiring 11b on the same surface (see FIG. 24A). The p-side wiring 11a and the n-side wiring 11b formed with a thickness of 25 μm on each support member 20. The anisotropic conductive material 23 prepared above is supplied thereto by dispensation to cover the p-side wiring 11a and the n-side wiring 11b formed on each support member 20 and the base 12 exposed between the wirings. The chip 9 obtained above is reversed from top to bottom, and placed thereon while being aligned with respect to the support member 20 (see FIG. 24B), and then a plurality of the chips 9 are pressed and heated at one time. Thus, the binder resin 22 is thermally cured while the conductive particles 21 are bonded between the p-side and n-side electrodes 6a, 6b and the p-side and n-side wirings 11a, 11b under pressure to ensure the electrical connection therebetween, and therefore the chips 9 are flip-chip mounted on the support members 20 (see FIG. 24C). The conductive particles 21 are immobilized between the p-side electrode 6a and the p-side wiring 11a while being pressed to have the height of about 1 μm. And the conductive particles 21 are immobilized between the n-side electrode 6b and the n-side wiring 11b while being pressed to have the height of about 3 μm. The solder particles as the auxiliary bonding material are heated to melt and bond the p-side electrode 6a to the p-side wiring 11a and the n-side electrode 6b to the n-side wiring 11b.

Figure 25A:
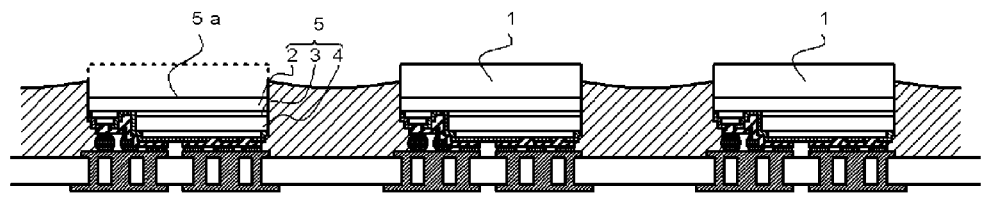
FIG. 25 shows schematic process steps for explaining a method for manufacturing a light emitting device according to example 3, FIG. 25A showing a substrate being irradiated with an excimer laser from the exposed surface (bottom) side to separate the substrate from the semiconductor layer at the boundary between an AlGaN layer and a non-doped GaN layer, FIG. 25B showing a collective substrate immersed in a TMAH solution to etch the upper surface of the semiconductor layer into a rough surface, FIG. 25C showing a phosphor sheet placed on the upper surface of the semiconductor layer and cured by heating, and FIG. 25D showing the collective substrate after being cut by laser dicing.

Thereafter, the substrate 1 (sapphire substrate) is irradiated with excimer laser (wavelength of 248 nm) from the exposed surface (bottom) side to separate the substrate 1 from the semiconductor layer 5 at the boundary between the AlGaN layer and the non-doped GaN layer (see FIG. 25A).

Figure 25B:
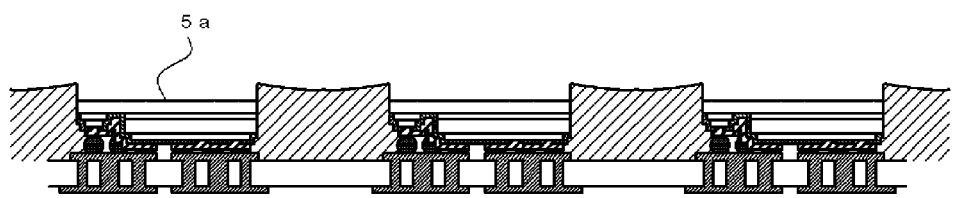

Thereafter, the collective substrate 200 is immersed in a TMAH solution to etch the upper surface of the semiconductor layer 5 into a rough surface (see FIG. 25B). Then, the collective substrate 200 is washed with pure water to remove the TMAH solution.

Figure 25C:
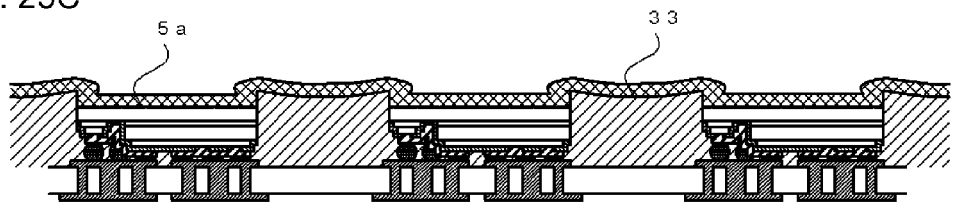

Thereafter, the phosphor sheet having a substantially same size with the collective substrate 200 and made of a silicone resin including LAG and SCASN phosphors is placed on the side of the upper surface 5a of the semiconductor layer 5 (exposed surface of the n-type semiconductor layer) and cured by heating to form a plurality of the light emitting elements 9' on the collective substrate 200 and the sealing member 33, which also functions as the phosphor layer, for sealing the upper surface of the anisotropic conductive material 23 at one time. (See FIG. 25C)

Figure 25D:
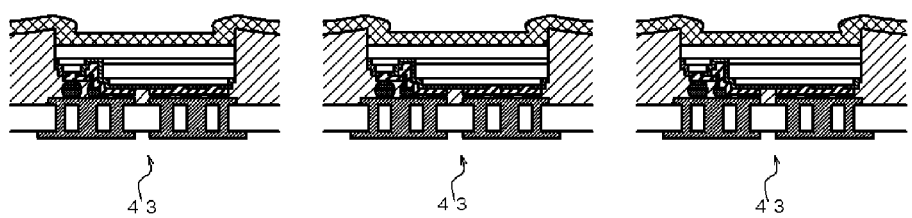

Finally, in order to obtain the light emitting device, the collective substrate 200 is cut by laser dicing corresponding to each one unit of the support members. (See FIG. 25D) At this time, the sealing member 33 is also cut together with the collective substrate 200.

In this way, the light emitting device 43 is manufactured.

Example 4

Figure 26:
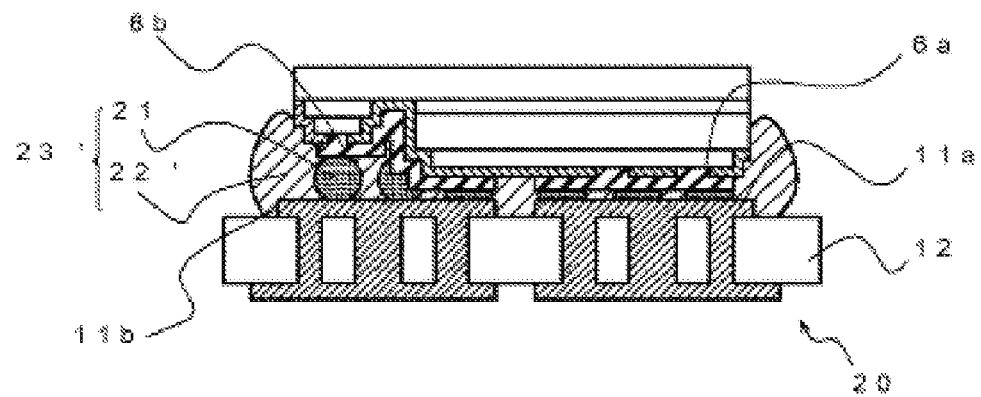
FIG. 26 shows a schematic cross-sectional view for explaining a light emitting device according to example 4, in which a film-like anisotropic conductive material is used as the anisotropic conductive material.

The light emitting device is manufactured in a similar manner to Example 3, expect for using a film-like anisotropic conductive material (ACF) as the anisotropic conductive material. In example 4, the film-like anisotropic conductive material 23 is placed on the support member 20, so that the anisotropic conductive material 23 can be supplied without using the method of dispensing, and therefore mass productivity can be increased. Further, in example 4, unlike the case of using the liquid anisotropic conductive material, the wall part 23a is not formed to be high, so that the step of removing the wall part can be omitted, and therefore mass productivity can be increased. (See FIG. 26)

Embodiments of the present invention can be applied to manufacture light emitting diodes used as a light source for illumination lamps, displays, optical communications, office automation equipment, and the like. Particularly, light emitting diodes obtained according to the present embodiment is applicable as point light sources, such as downlights, projectors, automotive headlamps, or camera flashes. However, the present embodiments are not limited to these applications.

What is claimed is:

1. A method for manufacturing a light emitting device, the method comprising:
    (a) preparing a structure including a substrate, a semiconductor layer formed on the substrate, and a p-side electrode and an n-side electrode formed on the semiconductor layer;
    (b) preparing a support member including a p-side wiring and an n-side wiring on the same surface thereof;
    (c) electrically connecting the p-side electrode and the n-side electrode of the structure to the p-side wiring and the n-side wiring of the support member, respectively, using an anisotropic conductive material containing conductive particles and a first resin; and
    after step (c), (p) forming a light reflector that extends laterally around the anisotropic conductive material such that the light reflector is completely separated from the structure in a lateral direction by the anisotropic conductive material, the light reflector having a higher reflectivity than that of the anisotropic conductive material, and (d) removing the substrate from the structure.

2. The method for manufacturing a light emitting device according to claim 1, wherein, in step (c), the anisotropic conductive material fills a space between the structure and the support member.

3. The method for manufacturing a light emitting device according to claim 2, wherein, in step (c), the anisotropic conductive material is at least partly in contact with a side surface of the substrate.

4. The method for manufacturing a light emitting device according to claims 1, wherein, in step (d), the removal of the substrate is conducted by laser irradiation at a wavelength capable of passing through the substrate.

5. The method for manufacturing a light emitting device according to claims 1, wherein the anisotropic conductive material further contains a filler having a heat conductivity that is higher than a heat conductivity of the first resin.

6. The method for manufacturing a light emitting device according to claim 5, wherein the filler is at least one selected from the group consisting of a metal oxide, a metal nitride, and carbon.

7. The method for manufacturing a light emitting device according to claim 1, wherein step (p) is conducted before step (d).

8. The method for manufacturing a light emitting device according to claim 1, wherein the light reflector is selected from the group consisting of a layer containing a silicone-based resin and light reflective particles dispersed therein, a metal layer, and a dielectric multilayer structure.

9. The method for manufacturing a light emitting device according to claims 1, further comprising:
    after step (d), (q) forming a phosphor layer on the semiconductor layer exposed by the removal of the substrate.

10. The method for manufacturing a light emitting device according to claim 9, wherein step (q) is conducted by bonding a phosphor sheet or electrodepositing a phosphor film on the semiconductor layer.

11. The method for manufacturing a light emitting device according to claim 9, further comprising:
    after step (d) and before the step (q), (r) removing a part of the anisotropic conductive material that protrudes relative to a top surface of the semiconductor layer exposed by the removal of the substrate.

12. The method for manufacturing a light emitting device according to claim 9, wherein step (q) is conducted by supplying a phosphor containing resin into a recessed portion surrounded by a wall part on the semiconductor layer, and curing the phosphor containing resin, wherein the wall part corresponds to the part of the anisotropic conductive material that protrudes relative to the top surface of the semiconductor layer exposed by the removal of the substrate.

13. The method for manufacturing a light emitting device according to claims 1, further comprising:
    before step (c), (s) forming bumps on the p-side electrode and the n-side electrode of the structure, or on the p-side wiring and the n-side wiring of the support member, and
    wherein, in step (c), the p-side electrode and the n-side electrode of the structure are electrically connected to the p-side wiring and the n-side wiring of the support member, respectively, via the bumps using the anisotropic conductive material.

14. The method for manufacturing a light emitting device according to claim 13, wherein
    in step (a), the p-side electrode and the n-side electrodes are covered with a protective film formed with openings, and
    in step (s), the bumps are formed on the p-side electrode and the n-side electrode so as to be positioned in the openings of the protective film and to have their respective tops protruding relative to the protective film.

15. The method for manufacturing a light emitting device according to claims 1, wherein the conductive particles comprise a core made of a second resin, and a conductive layer covering the core and made of metal.

16. The method for manufacturing a light emitting device according to claim 15, wherein a ratio of an absolute value of a difference between a thermal expansion coefficient of the first resin and a thermal expansion coefficient of the second resin to the thermal expansion coefficient of the first resin is 1.0 or less.

17. The method for manufacturing a light emitting device according to claim 15, wherein a ratio of an absolute value of a difference between a thermal expansion coefficient of the second resin and an average thermal expansion coefficient of a material corresponding to the anisotropic conductive material from which the conductive particles are excluded, to the average thermal expansion coefficient is 1.0 or less.

18. The method for manufacturing a light emitting device according to claims 1, wherein, in step (a), the structure includes the substrate, the semiconductor layer formed on the substrate and including a n-type semiconductor layer and a p-type semiconductor layer, the n-side electrode electrically connected to the n-type semiconductor layer, the p-side electrode electrically connected to the p-type semiconductor layer, and a metal member formed on an opposite surface of the semiconductor layer to the substrate so as to overlap with the n-type-semiconductor layer and the p-type semiconductor layer.

19. The method for manufacturing a light emitting device according to claim 18, wherein the metal member is formed to overlap with the second semiconductor layer while an insulating layer is disposed therebetween.

20. The method for manufacturing a light emitting device according to claim 18, wherein the metal member corresponds to the n-side electrode formed to overlap with the second semiconductor layer.

21. The method for manufacturing a light emitting device according to claims 18, wherein a difference in height between the n-side electrode and the p-side electrode is smaller than a difference in height between the n-type semiconductor layer and the p-type semiconductor layer.

22. The method for manufacturing a light emitting device according to claims 18, wherein the support member is prepared as a collective substrate in which a plurality of support members are coupled together.

23. The method for manufacturing a light emitting device according to claim 22, further comprising:

dividing the collective substrate to obtain the light emitting device.

24. A method for manufacturing a light emitting device, the method comprising:
  (a) preparing a structure including a substrate, a semiconductor layer formed on the substrate, and a p-side electrode and an n-side electrode formed on the semiconductor layer;
  (b) preparing a support member including a p-side wiring and an n-side wiring on the same surface thereof;
  (c) electrically connecting the p-side electrode and then-side electrode of the structure to the p-side wiring and then-side wiring of the support member, respectively, using an anisotropic conductive material containing conductive particles and a first resin, such that the anisotropic conductive material fills a space between the structure and the support member and is at least partly in contact with a side surface of the substrate; and
  after step (c), (d) removing the substrate from the structure, such that a part of the anisotropic conductive material protrudes upwardly relative to a top surface of the semiconductor layer exposed by the removal of the substrate.

25. The method for manufacturing a light emitting device according to claim 24, further comprising:
  after step (d), (q) forming a phosphor layer on the semiconductor layer exposed by the removal of the substrate.

26. The method for manufacturing a light emitting device according to claim 25, further comprising:
  after step (d) and before step (q), (r) removing the part of the anisotropic conductive material that protrudes upwardly relative to the top surface of the semiconductor layer exposed by the removal of the substrate.

27. The method for manufacturing a light emitting device according to claim 25, wherein step (q) is conducted by supplying a phosphor containing resin into a recessed portion surrounded by a wall part on the semiconductor layer, and curing the phosphor containing resin, wherein the wall part corresponds to the part of the anisotropic conductive material that protrudes relative to the top surface of the semiconductor layer exposed by the removal of the substrate.

* * * * *